United States Patent
Watanabe et al.

(10) Patent No.: US 9,722,170 B2
(45) Date of Patent: Aug. 1, 2017

(54) PIEZOELECTRIC MATERIAL, PIEZOELECTRIC ELEMENT, AND ELECTRONIC DEVICE

(71) Applicant: CANON KABUSHIKI KAISHA, Tokyo (JP)

(72) Inventors: Takayuki Watanabe, Yokohama (JP); Hidenori Tanaka, Yokohama (JP); Shunsuke Murakami, Kawasaki (JP); Tatsuo Furuta, Machida (JP); Hisato Yabuta, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 596 days.

(21) Appl. No.: 14/328,466

(22) Filed: Jul. 10, 2014

(65) Prior Publication Data
US 2015/0015121 A1    Jan. 15, 2015

(30) Foreign Application Priority Data

Jul. 12, 2013  (JP) ................. 2013-146304
May 27, 2014  (JP) ................. 2014-109342

(51) Int. Cl.
*H01L 41/187*  (2006.01)
*C04B 35/00*  (2006.01)
(Continued)

(52) U.S. Cl.
CPC ........ *H01L 41/183* (2013.01); *B41J 2/14233* (2013.01); *C04B 35/4682* (2013.01);
(Continued)

(58) Field of Classification Search
CPC ..................................... H01B 3/10
(Continued)

(56) References Cited

U.S. PATENT DOCUMENTS 9,144,971 B2 *  9/2015  Watanabe ............ B41J 2/14201
2009/0207551 A1  8/2009  Suzuki
(Continued)

FOREIGN PATENT DOCUMENTS

| CN | 1635592 A | 7/2007 |
|---|---|---|
| CN | 101026035 A | 8/2007 |

(Continued)

OTHER PUBLICATIONS

Karaki T et al: "Modified BaTiO3 Piezoelectric Ceramics with Bi2O3—Li2O Additive", Ferroelectrics, Jan. 1, 2012 (Jan. 1, 2012), pp. 83-87, vol. 439, No. 1, Taylor & Francis Inc., US.

(Continued)

*Primary Examiner* — Thomas Dougherty
(74) *Attorney, Agent, or Firm* — Canon U.S.A., Inc. IP Division

(57) ABSTRACT

There is provided a piezoelectric material not containing any lead component, having stable piezoelectric characteristics in an operating temperature range, a high mechanical quality factor, and satisfactory piezoelectric characteristics. The piezoelectric material includes a main component containing a perovskite-type metal oxide that can be expressed using the following general formula (1), and subcomponents containing Mn, Li, and Bi. When the metal oxide is 100 parts by weight, the content of Mn on a metal basis is not less than 0.04 parts by weight and is not greater than 0.36 parts by weight, content $\alpha$ of Li on a metal basis is not less than 0.0013 parts by weight and is not greater than 0.0280 parts by weight, and content $\beta$ of Bi on a metal basis is not less than 0.042 parts by weight and is not greater than 0.850 parts by weight $$(Ba_{1-x}Ca_x)_a(Ti_{1-y-z}Zr_ySn_z)O_3 \quad (1)$$

(Continued)

(in the formula (1), $0.09 \leq x \leq 0.30$, $0.074 < y \leq 0.085$, $0 \leq z \leq 0.02$, and $0.986 \leq a \leq 1.02$).

31 Claims, 15 Drawing Sheets

(51) Int. Cl.
    *H01L 41/18*     (2006.01)
    *C04B 35/468*     (2006.01)
    *B41J 2/14*     (2006.01)
    *G02B 7/04*     (2006.01)
    *H01L 41/083*     (2006.01)
    *H01L 41/09*     (2006.01)
    *H02N 2/16*     (2006.01)
    *G02B 27/00*     (2006.01)
    *H02N 2/10*     (2006.01)
    *G02B 15/02*     (2006.01)
    *H04N 5/232*     (2006.01)
    *G03B 3/10*     (2006.01)

(52) U.S. Cl.
    CPC ........... *G02B 7/04* (2013.01); *G02B 27/0006* (2013.01); *H01L 41/083* (2013.01); *H01L 41/0973* (2013.01); *H01L 41/1871* (2013.01); *H02N 2/106* (2013.01); *H02N 2/163* (2013.01); *B41J 2202/03* (2013.01); *G02B 15/02* (2013.01); *G03B 3/10* (2013.01); *H04N 5/23209* (2013.01)

(58) Field of Classification Search
    USPC ....... 310/358; 252/62.9 PZ, 62.9 R; 501/134
    See application file for complete search history.

(56) References Cited

U.S. PATENT DOCUMENTS

| | | | |
|---|---|---|---|
| 2010/0096952 | A1 | 4/2010 | Fukuoka |
| 2010/0220427 | A1 | 9/2010 | Symes, Jr. |
| 2011/0164331 | A1 | 7/2011 | Sugiyama |
| 2011/0298336 | A1 | 12/2011 | Saito |
| 2012/0033343 | A1 | 2/2012 | Yoon |
| 2012/0038714 | A1 | 2/2012 | Harigai |

FOREIGN PATENT DOCUMENTS

| | | | |
|---|---|---|---|
| CN | 101935212 A | | 1/2011 |
| CN | 101970374 A | | 2/2011 |
| CN | 102531578 A | | 7/2012 |
| CN | 102531593 A | | 7/2012 |
| EP | 2749550 A2 | | 7/2014 |
| JP | 2009-215111 A | | 9/2009 |
| KR | 10-2003-0014712 A | | 2/2003 |
| KR | 10-2012-0023509 A | | 3/2012 |
| TW | 201432963 A | | 8/2014 |
| WO | 2012/093646 A1 | | 7/2012 |
| WO | 2012/105584 A1 | | 8/2012 |
| WO | 2013/005700 A1 | | 1/2013 |
| WO | 2013/005701 A1 | | 1/2013 |
| WO | 2013/005702 A1 | | 1/2013 |

OTHER PUBLICATIONS

Yoon M S et al: "Effects of A-site Ca and B-site Zr substitution on dielectric properties and microstructure in tin-doped BaTiO3—CaTiO3 composites", Ceramics International, Dec. 1, 2008 (Dec. 1, 2008), pp. 1941-1948, vol. 34, No. 8, Elsevier, Amsterdam, NL.
Prakash, Rahul. Synthesis, Characterization and Effect of Atmosphere on Sintering Behavior or BatiO3 Nano-Powder. Department of Ceramic Engineering, National Institute of Technology, Rourkela 2011.

* cited by examiner

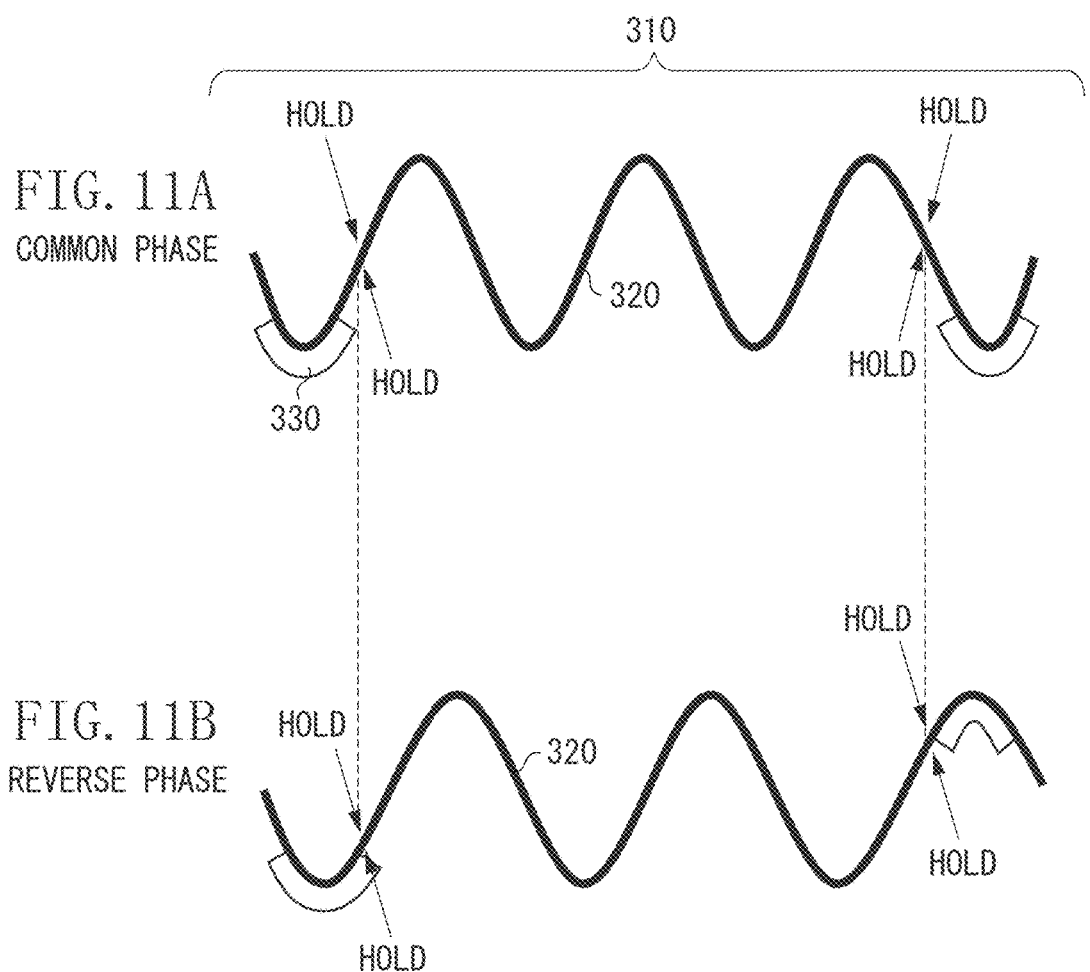

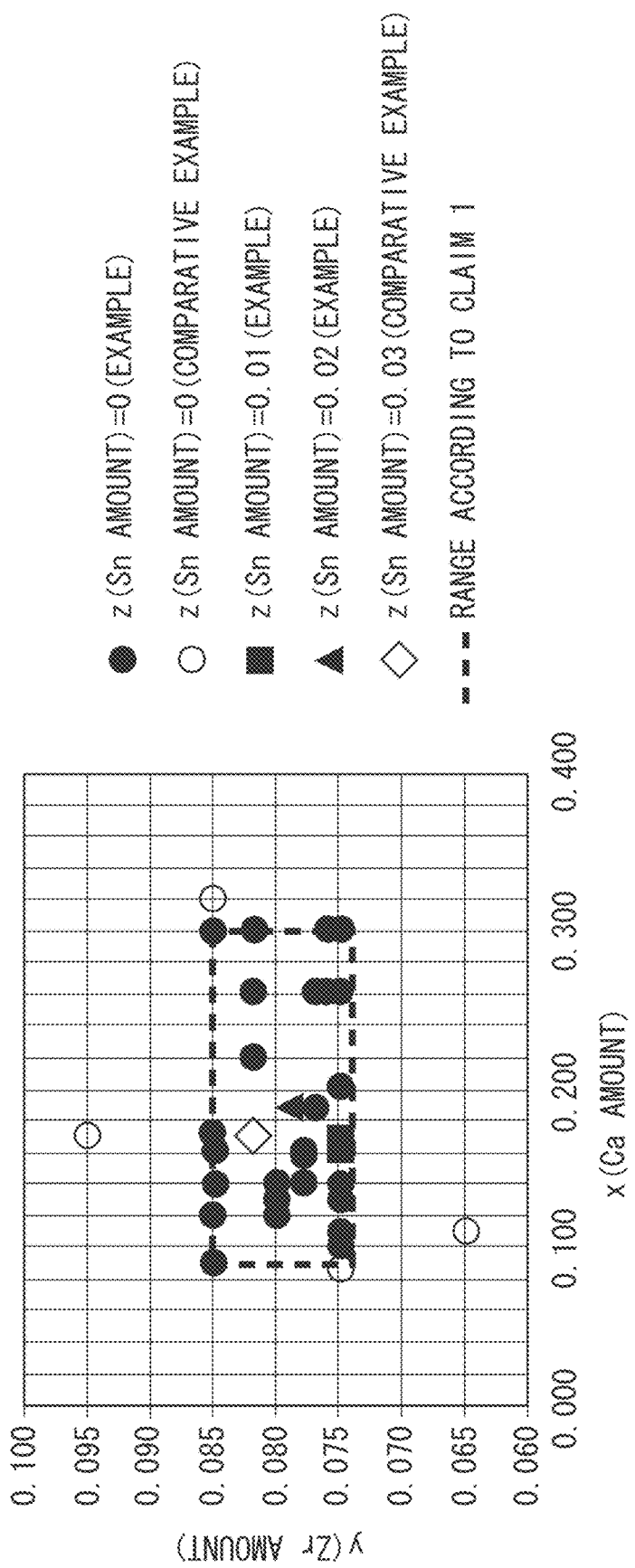

PIEZOELECTRIC MATERIAL, PIEZOELECTRIC ELEMENT, AND ELECTRONIC DEVICE

BACKGROUND OF THE INVENTION

Field of the Invention

The present invention relates to a piezoelectric material, more specifically, to a piezoelectric material that does not contain any lead component. Further, the present invention relates to a piezoelectric element, a multilayered piezoelectric element, a liquid discharge head, a liquid discharge apparatus, an ultrasonic motor, an optical device, a vibrating apparatus, a dust removing apparatus, an imaging apparatus, and an electronic device, in which the piezoelectric material is employed.

Description of the Related Art

A lead zirconate titanate is a representative lead-containing piezoelectric material, which can be used in various piezoelectric devices, such as an actuator, an oscillator, a sensor, and a filter. However, a lead component is harmful to the ecological system because there is a possibility that the lead component of a wasted piezoelectric material may dissolve into the soil. Accordingly, research and development enthusiastically performed recently is directed to non-lead piezoelectric materials that can realize non-lead piezoelectric devices.

When a piezoelectric element is employed in a home electrical appliance or a similar product, it is required that the piezoelectric performances do not greatly change in an operating temperature range of the product. If a parameter relating to the piezoelectric performances, e.g., an electro-mechanical coupling factor, dielectric constant, a Young's modulus, a piezoelectric constant, a mechanical quality factor, or resonance frequency, greatly changes (for example, by an amount equivalent to 30% or more) depending on the temperature, it becomes difficult to obtain stable element performances in the operating temperature range. In a phase transition of the piezoelectric material, the piezoelectricity is maximized at a phase transition temperature. Therefore, the phase transition is a factor that causes a great change in piezoelectric characteristics. Therefore, it is a key to obtain a product whose piezoelectric performances do not change so greatly in the operating temperature range that the phase transition temperature of a piezoelectric material is not in the operating temperature range.

When a resonance device (e.g., an ultrasonic motor) includes a piezoelectric composition, the mechanical quality factor that represents the sharpness of resonance is required to be large. If the mechanical quality factor is low, an amount of electric power required to operate a piezoelectric element becomes higher and a driving control of the piezoelectric element becomes difficult due to heat generation. This is the reason why a piezoelectric material possessing a higher mechanical quality factor is required.

A non-lead piezoelectric material expressed by a pseudo-binary system solid solution of $\{[(Ba_{1-x1}M1_{x1})((Ti_{1-x}Zr_x)_{1-y}N1_{y1})O_3]\text{-}\delta\% \ [(Ba_{1-y}Ca_y)_{1-x2}M2_{x2})(Ti_{1-y2}N2_{y2})O_3]\}$, in which M1, N1, M2, and N2 are additive elements, is discussed in Japanese Patent Application Laid-Open No. 2009-215111. $(Ba_{1-x1}M1_{x1})((Ti_{1-x}Zr_x)_{1-y1}N1_{y1})O_3$ is a rhombohedral and $(Ba_{1-y}Ca_y)_{1-x2}M2_{x2})(Ti_{1-y2}N2_{y2})O_3$ is a tetragonal. Dissolving two components different in the crystal system enables to adjust the temperature at which the phase transition occurs between the rhombohedral and the tetragonal around the room temperature. For example, according to the discussed contents, the phase transition of $BaTi_{0.8}Zr_{0.2}O_3\text{-}50\% \ Ba_{0.7}Ca_{0.3}TiO_3$ occurs around the room temperature and a piezoelectric constant $d_{33}$ at 20° C. is 584 pC/N. On the other hand, a piezoelectric constant $d_{33}$ at 70° C. of the same material is 368 pC/N. More specifically, if an increased amount in the temperature is 50° C., a reduction amount in the piezoelectric constant $d_{33}$ is 37%. The above-mentioned piezoelectric material is characterized in that a phase transition at which the piezoelectricity is maximized occurs around the room temperature. Therefore, although the above-mentioned piezoelectric material demonstrates excellent piezoelectric performances around the room temperature, it is not desired that the piezoelectric performances is remarkably variable depending on the temperature. In the above-mentioned material, the Zr amount (x) is set to be greater than 0.1 to obtain a rhombohedral of $(Ba_{1-x1}M1_{x1})((Ti_{1-x}Zr_x)_{1-y1}N1_{y1})O_3$, which is an edge component.

The material discussed in Karaki, 15th US-Japan Seminar on Dielectric and Piezoelectric Ceramics Extended Abstract, p. 40 to 41 is a non-lead piezoelectric ceramics that can be obtained by sintering $BaTiO_3$ that includes additives of MnO (0.03 parts by weight) and $LiBiO_2$ (0 to 0.3 parts by weight) according to a two-step sintering method. The addition of $LiBiO_2$ substantially increases the coercive electric field of $BaTiO_3$ including the additive of MnO (0.03 parts by weight) linearly in proportion to the addition amount of $LiBiO_2$. Further, the addition of $LiBiO_2$ substantially decreases the piezoelectric constant $d_{33}$, the dielectric constant, and the dielectric tangent. When the addition amount of $LiBiO_2$ is 0.17 parts by weight, the piezoelectric constant $d_{33}$ is 243 pC/N and the coercive electric field is 0.3 kV/mm. When the addition amount of $LiBiO_2$ is 0.3 parts by weight, the coercive electric field is 0.5 kV/mm. However, according to an evaluation result, the above-mentioned piezoelectric material is not desired in that the temperature at which a phase transition occurs between the tetragonal and the orthorhombic is in a range from 5° C. to −20° C. Further, the above-mentioned piezoelectric material is not desired in that the mechanical quality factor at the room temperature is low (less than 500).

The above-mentioned conventional non-lead piezoelectric ceramics is not desired in that the piezoelectric performances greatly vary in the operating temperature range of a piezoelectric element and the mechanical quality factor is small.

To solve the above-mentioned problems, the present invention is directed to a piezoelectric material that does not contain any lead component and is characterized in that the temperature dependency in the piezoelectric constant is small in the operating temperature range, the density is high, the mechanical quality factor is high, and the piezoelectric constant is satisfactory. Further, the present invention is directed to a piezoelectric element, a multilayered piezoelectric element, a liquid discharge head, a liquid discharge apparatus, an ultrasonic motor, an optical device, a vibrating apparatus, a dust removing apparatus, an imaging apparatus, and an electronic device, in which the piezoelectric material is employed.

SUMMARY OF THE INVENTION

To solve the above-mentioned problem, a piezoelectric material according to the present invention includes a main component containing a perovskite-type metal oxide that can be expressed using the following general formula (1), a first subcomponent containing Mn, a second subcomponent containing Li, and a third subcomponent containing Bi, wherein the content of Mn on a metal basis is not less than 0.04 parts by weight and is not greater than 0.36 parts by weight when the metal oxide is 100 parts by weight, content α of Li on a metal basis is greater than 0.0013 parts by weight and is not greater than 0.0280 parts by weight when the metal oxide is 100 parts by weight, and content β of Bi on a metal basis is not less than 0.042 parts by weight and is not greater than 0.850 parts by weight when the metal oxide is 100 parts by weight

$$(Ba_{1-x}Ca_x)_a(Ti_{1-y-z}Zr_ySn_z)O_3 \qquad (1)$$

(in the formula (1), 0.09≤x≤0.30, 0.074<y≤0.085, 0≤z≤0.02, and 0.986≤a≤1.02).

A piezoelectric element according to the present invention includes a first electrode, a piezoelectric material portion, and a second electrode, wherein a piezoelectric material that constitutes the piezoelectric material portion is the above-mentioned piezoelectric material.

A multilayered piezoelectric element according to the present invention includes a plurality of piezoelectric material layers and a plurality of electrode layers including at least one internal electrode that are alternately multilayered, wherein the piezoelectric material layer is made of the above-mentioned piezoelectric material.

A liquid discharge head according to the present invention includes a liquid chamber that is equipped with a vibrating unit in which the above-mentioned piezoelectric element or the above-mentioned multilayered piezoelectric element is disposed, and a discharge port that communicates with the liquid chamber.

A liquid discharge apparatus according to the present invention includes a portion on which an image transferred medium is placed, and the above-mentioned liquid discharge head.

An ultrasonic motor according to the present invention includes a vibrating body in which the above-mentioned piezoelectric element or the above-mentioned multilayered piezoelectric element is disposed, and a moving body that contacts the vibrating body.

An optical device according to the present invention includes a driving unit that includes the above-mentioned ultrasonic motor.

A vibrating apparatus according to the present invention includes a vibrating body in which the above-mentioned piezoelectric element or the above-mentioned multilayered piezoelectric element is disposed on a vibration plate.

A dust removing apparatus according to the present invention includes a vibrating unit in which the above-mentioned vibrating apparatus is provided.

An imaging apparatus according to the present invention includes the above-mentioned dust removing apparatus and an image sensor unit, wherein a vibration plate of the dust removing apparatus is provided closely to a light-receiving surface of the image sensor unit.

An electronic device according to the present invention includes a piezoelectric acoustic device in which the above-mentioned piezoelectric element or the above-mentioned multilayered piezoelectric element is disposed.

According to the present invention, there is provided a piezoelectric material that does not contain any lead component and is characterized in that the temperature dependency in the piezoelectric constant is small in the operating temperature range of a piezoelectric element, the density is high, the mechanical quality factor is high, and the piezoelectric constant is satisfactory. Further, the piezoelectric material according to the present invention does not contain any lead component and therefore can reduce an environmental load.

Further features of the present invention will become apparent from the following description of examples with reference to the attached drawings.

BRIEF DESCRIPTION OF THE DRAWINGS

FIGS. 11A and 11B are schematic diagrams illustrating a principle of vibrations occurring in the dust removing apparatus according to an embodiment of the present invention.

FIG. 15 is a phase diagram illustrating a relationship between x value and y value (z=0, 0.01, 0.02, and 0.03) of piezoelectric materials in examples 1 to 54, and 70 of the present invention and in comparative examples 1 to 12 and 14 to 22, in which a dotted line indicates the composition range of the x value and the y value according to claim 1.

DESCRIPTION OF THE EMBODIMENTS

Figure 1:
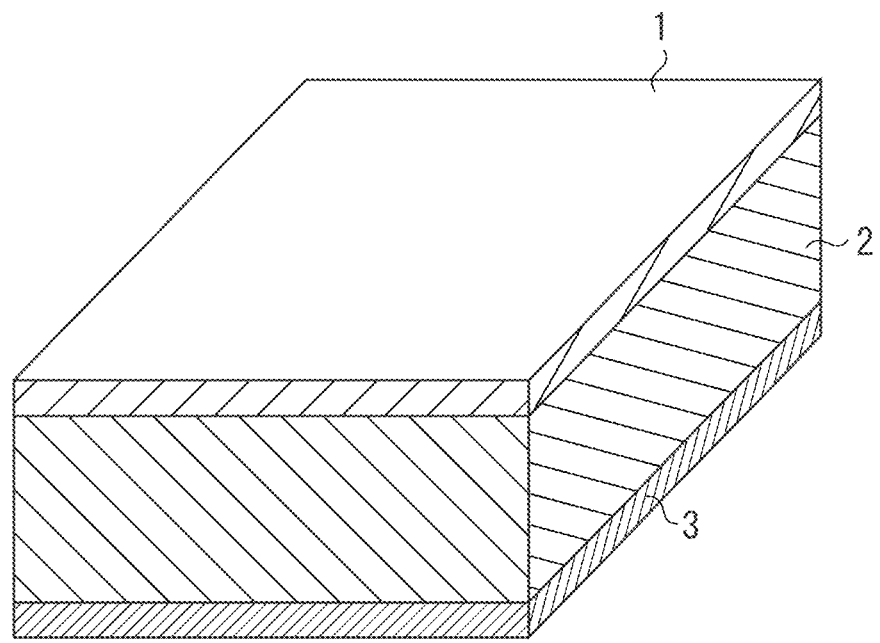
FIG. 1 schematically illustrates a configuration of a piezoelectric element according to an embodiment of the present invention.

Hereinafter, various embodiments, features, and aspects of the invention will be described in detail below with reference to the drawings.

The present invention provides a non-lead piezoelectric material that contains (Ba,Ca)(Ti,Zr,Sn)O₃ as a main component and has satisfactory piezoelectricity and insulating properties. Further, the non-lead piezoelectric material according to the present invention is higher in density and mechanical quality factor. The temperature dependency in the piezoelectric constant is small in an operating temperature range (e.g., from 20° C. to 45° C.). A piezoelectric material according to the present invention has ferroelectric substance characteristics and is employed for various devices, such as a memory or a sensor.

The piezoelectric material according to the present invention includes a main component containing a perovskite-type metal oxide that can be expressed using the following general formula (1), a first subcomponent containing Mn, a second subcomponent containing Li, and a third subcomponent containing Bi. The content of Mn on a metal basis is not less than 0.04 parts by weight and is not greater than 0.36 parts by weight when the metal oxide is 100 parts by weight. Content α of Li on a metal basis is greater than 0.0013 and is not greater than 0.0280 parts by weight when the metal oxide is 100 parts by weight. Content β of Bi on a metal basis is not less than 0.042 parts by weight and is not greater than 0.850 parts by weight when the metal oxide is 100 parts by weight.

General formula (1)

$$(Ba_{1-x}Ca_x)_a(Ti_{1-y-z}Zr_ySn_z)O_3 \quad (1)$$

(In the formula, $0.09 \leq x \leq 0.30$, $0.074 < y \leq 0.085$, $0 \leq z \leq 0.02$, and $0.986 \leq a \leq 1.02$)

In the present invention, the perovskite-type metal oxide is a metal oxide that has a perovskite-type structure (which may be referred to as a perovskite structure), which is for example described in the fifth edition of Iwanami Dictionary of Physics and Chemistry (Iwanami Shoten, published on Feb. 20, 1998). In general, the metal oxide including the perovskite-type structure can be expressed using a chemical formula of $ABO_3$. Two chemical elements A and B contained in the perovskite-type metal oxide are positioned at "A site" and "B site", respectively, in the form of ions. Each of the "A site" and the "B site" is a specific position of the unit cell. For example, in a unit cell of cubic system, the chemical element "A" is positioned at a vertex of a cube. The chemical element B is positioned at the center of the cube. The element "O" is positioned at the center of a face of the cube, in the form of an oxygen anion.

The content of each subcomponent (e.g., Mn, Bi or Li) "on a metal basis" indicates the following value. For example, a method for obtaining the content of Mn includes measuring contents of respective metals Ba, Ca, Ti, Sn, Zr, Mn, Bi, and Li contained in the piezoelectric material through X-ray fluorescence analysis (XRF), ICP emission spectrophotometric analysis, or atomic absorption analysis. Further, the method includes calculating a chemical element that constitutes the metal oxide expressed using the general formula (1), as a value comparable to an oxide. The method further includes obtaining a ratio of the Mn weight when the total weight of respective elements is 100.

The piezoelectric material according to the present invention includes the perovskite-type metal oxide as a main phase, because the perovskite-type metal oxide has excellent insulating properties. As a way of determining whether the perovskite-type metal oxide is the main phase, for example, it is useful to check whether a maximum diffraction strength deriving from the perovskite-type metal oxide is equal to or greater than 100 times a maximum diffraction strength deriving from an impurity phase in the X-ray diffraction. It is desired that the piezoelectric material is wholly constituted by the perovskite-type metal oxide because the insulating properties can be maximized. The "main phase" means that the strongest peak of diffraction strength is caused by the perovskite-type structure in the powder X-ray diffraction of the piezoelectric material. A more desirable phase is a "single phase" according to which the piezoelectric material is entirely occupied by perovskite-type structure crystals.

The general formula (1) indicates that the metal oxide expressed using this formula contains Ba and Ca as metal elements positioned at the A site and Ti, Zr, and Sn as metal elements positioned at the B site. However, Ba and Ca can be partly positioned at the B site. Similarly, Ti and Zr can be partly positioned at the A site. However, it is not desired that Sn is positioned at the A site because the piezoelectric characteristics may deteriorate and the synthesis condition may be limited.

In the general formula (1), the molar ratio between the chemical element positioned at the B site and the O element is 1:3. However, even if the element amount ratio deviates slightly (e.g., in a range from 1.00:2.94 to 1.00:3.06), the present invention encompasses such a deviation in the range of the element amount ratio when the metal oxide contains the perovskite-type structure as the main phase.

The piezoelectric material according to the present invention is not restricted to have a specific form and therefore can be configured as ceramics, powder, monocrystal, film, or slurry, although ceramics is desired. In the following description, "ceramics" represents a polycrystal containing a metal oxide as a basic component and configured as an aggregate (or a bulk body) of crystal grains sintered through a heat treatment. The "ceramics" according to the present invention can be a fabricated product obtained after the sintering processing.

In the general formula (1), when "x" representing the Ca amount is in a range of $0.09 \leq x \leq 0.30$, "y" representing the Zr amount is in a range of $0.074 < y \leq 0.085$, "z" representing the Sn amount is in a range of $0 \leq z \leq 0.02$, and "a" representing the molar ratio between the A site and the B site is in a range of $0.986 \leq a \leq 1.02$, the piezoelectric constant becomes a satisfactory value in the operating temperature range.

In the general formula (1), the Ca amount "x" is in the range of $0.09 \leq x \leq 0.30$. If the Ca amount "x" is less than 0.09, temperature $T_{to}$ at which a phase transition from a tetragonal to an orthorhombic occurs becomes higher than $-10°$ C. As a result, the temperature dependency in the piezoelectric constant becomes greater in the operating temperature range.

On the other hand, if the Ca amount "x" is greater than 0.30, the piezoelectric constant decreases due to a generation of $CaTiO_3$ (i.e., impurity phase) because Ca is not sufficiently soluble when the sintering temperature is equal to or lower than 1400° C. Further, to obtain a desired piezoelectric constant, it is desired to set the Ca amount "x" to be equal to or less than 0.26 (i.e., $x \leq 0.26$). It is more desirable that the Ca amount "x" is equal to or smaller 0.17 (i.e., $x \leq 0.17$).

In the general formula (1), the Zr amount "y" is in the range of $0.074 < y \leq 0.085$. If the Zr amount "y" is greater than 0.074, a satisfactory piezoelectric constant can be obtained. If the Zr amount "y" is greater than 0.085, the Curie temperature (hereinafter, referred to as $T_C$) may become lower than 100° C. To obtain satisfactory piezoelectric characteristics and set the Curie temperature $T_c$ to be not lower than 100° C., the Zr amount "y" is in the range of $0.074 \leq y \leq 0.085$.

If the Zr amount "y" is equal to or greater than 0.075, it is feasible to increase the dielectric constant at the room temperature. Accordingly, the piezoelectric characteristics can be further increased. In view of the foregoing, it is desired to set the range of Zr amount "y" to be equal to or greater than 0.075. Further, to obtain desired piezoelectricity, it is desired that the range of Zr amount "y" is equal to or greater than 0.076.

It is desired that the Sn amount "z" is in the range of $0 \leq z \leq 0.02$. Similar to the replacement by Zr, replacing Ti by Sn brings the effect of increasing the dielectric constant at the room temperature and increasing the piezoelectric constant. Adding Zr or Sn is effective to enhance the dielectric characteristics of the piezoelectric material. However, the phase transition temperature $T_{to}$ of the piezoelectric material increases when Ti is replaced by Zr or Sn. If the phase transition temperature $T_{to}$ is in the operating temperature range, the temperature dependency in the piezoelectric constant becomes larger undesirably. Therefore, it is necessary to add Ca to cancel an increased amount of the phase transition temperature $T_{to}$ if it is increased by the addition of Zr or Sn, because Ca brings an effect of lowering the phase transition temperature $T_{to}$. However, replacing Ti by Sn is superior to replacing Ti by Zr in view of suppressing the increased amount of the phase transition temperature $T_{to}$. For example, if 1% of Ti constituting $BaTiO_3$ is replaced by Zr, the phase transition temperature $T_{to}$ increases by an amount of approximately 12° C. On the other hand, if 1% of Ti is replaced by Sn, the phase transition temperature $T_{to}$ increases by an amount of approximately 5° C. Therefore, the Ca amount can be effectively reduced by replacing Ti by Sn. However, it is not desired that the Sn amount "z" is less than 0.02 (i.e., z>0.02), because the Curie temperature $T_c$ becomes lower than 100° C. if the Zr amount is inappropriate.

The ratio "a" {a=(Ba+Ca)/(Zr+Ti+Sn)} representing the ratio of the total mole number of Ba and Ca to the total mole number of Zr, Ti, and Sn is in the range of 0.986≤a≤1.02. If the ratio "a" is less than 0.986, an abnormal grain growth may occur when the piezoelectric material is sintered. Further, an average grain diameter becomes greater than 50 μm and the mechanical strength of the material decreases. If the ratio "a" is greater than 1.02, the density of an obtained piezoelectric material will not be sufficiently high. If the density of the piezoelectric material is low, the piezoelectricity decreases. In the present invention, a density difference between a test piece having been sintered insufficiently and a test piece having been sintered insufficiently is not less than 5%. To obtain a piezoelectric material that is higher in density and excellent in mechanical strength, the ratio "a" is in the range of 0.986≤a≤1.02.

The piezoelectric material according to the present invention includes Mn as the first subcomponent whose content on a metal basis is not less than 0.04 parts by weight and is not greater than 0.36 parts by weight when the perovskite-type metal oxide expressed using the general formula (1) is 100 parts by weight. If Mn in the above-mentioned range is included, the mechanical quality factor increases. However, if the content of Mn is less than 0.04 parts by weight, it is unfeasible to obtain the effect of increasing the mechanical quality factor. On the other hand, if the content of Mn is greater than 0.36 parts by weight, the insulation resistance of the piezoelectric material decreases. When the insulating resistance is low, the dielectric tangent at the room temperature exceeds 0.01 or the resistivity becomes equal to or less than 1G 0 cm. An impedance analyzer is usable to measure the dielectric tangent at the room temperature in a state where an AC electric field having a field intensity of 10 V/cm is applied at the frequency of 1 kHz.

It is desired that the dielectric tangent of the piezoelectric material according to the present invention is equal to or less than 0.006 at the frequency of 1 kHz. When the dielectric tangent is equal to or less than 0.006, it is feasible to obtain a stable operation even when the piezoelectric material is driven in a state where an electric field having a maximum field intensity of 500 V/cm is applied to the piezoelectric material under element driving conditions.

The form of Mn is not limited to a metal and can be an Mn component contained in the piezoelectric material. For example, Mn is soluble at the B site or can be positioned at the grain boundary. Further, it is useful that an Mn component in the form of metal, ion, oxide, metal salt, or complex is contained in the piezoelectric material. It is desirable that the piezoelectric material contains Mn to enhance insulating properties and improve sintering easiness. In general, the valence of Mn is 4+, 2+, or 3+. If a conduction electron is present in the crystal (e.g., when an oxygen defect is present in the crystal or when a donor element occupies the A site), the valence of Mn decreases from 4+ to 3+ or 2+ to trap the conduction electron. Therefore, the insulating resistance can be improved.

On the other hand, if the valence of Mn is lower than 4+ (e.g., when the valence of Mn is 2+), Mn serves as an acceptor. When the acceptor of Mn is present in a perovskite structured crystal, a hole is generated in the crystal or an oxygen vacancy is formed in the crystal.

If the valence of added Mn is mostly 2+ or 3+, the insulating resistance decreases significantly because the hole cannot be compensated sufficiently by the introduction of the oxygen vacancy. Accordingly, it is desired that most of Mn is 4+. However, a very small amount of Mn has a valence lower than 4+ and therefore serves as an acceptor that occupies the B site of the perovskite structure and may form an oxygen vacancy. Mn having a valence of 2+ or 3+ and the oxygen vacancy form a defect dipole, which can increase the mechanical quality factor of the piezoelectric material. If a trivalent Bi occupies the A site, Mn tends to take a valence lower than 4+ to maintain the charge balance.

The valence of a very small amount of Mn added to a non-magnetic (diamagnetic) material can be evaluated by measuring a temperature dependency in magnetic susceptibility. The magnetic susceptibility can be measured by a superconducting quantum interference device (SQUID), a vibrating sample magnetometer (VSM), or a magnetic balance. The Curie-Weiss Law that can be expressed by the following general formula 2 is usable to express the magnetic susceptibility x obtained through the above-mentioned measurement.

$$\chi = C/(T-\theta) \quad \text{(Formula 2)}$$

In the formula 2, C represents Curie constant and e represents paramagnetic Curie temperature.

In general, a very small amount of Mn added to a non-magnetic material takes a spin value S=5/2 when the valence is 2+, S=2 when 3+, and S=3/2 when 4+. Accordingly, a Curie constant C per unit Mn amount takes a value corresponding to the spin S value at each valence of Mn. In other words, an average valence of Mn contained in a test piece can be evaluated by deriving the Curie constant C from the temperature dependency in the magnetic susceptibility $\chi$.

To evaluate the Curie constant C, it is desired to set the starting temperature as low as possible in the measurement of the temperature dependency in the magnetic susceptibility. In other words, the measurement becomes difficult if the Mn amount is a very small amount because the magnetic susceptibility takes a very small value at a comparatively high temperature (including the room temperature). The Curie constant C can be derived from the gradient of a straight line obtainable when a reciprocal $1/\chi$ of the magnetic susceptibility is plotted in relation to the temperature T in the collinear approximation.

The piezoelectric material according to the present invention includes Li as the second subcomponent whose content on a metal basis is not less than 0.0013 parts by weight and is not greater than 0.0280 parts by weight and Bi as the third subcomponent whose content on a metal basis is not less than 0.042 parts by weight and is not greater than 0.850 parts by weight when the perovskite-type metal oxide that can be expressed using the general formula (1) is 100 parts by weight. If the content of Li is greater than 0.0280 parts by weight, the electromechanical coupling factor decreases. If the content of Li is equal to or less than 0.0280, the sintering is feasible at a lower temperature without deteriorating piezoelectric characteristics, compared to a referential material that does not contain any Li component.

Further, if the content of Bi is less than 0.042 parts by weight, the effect of lowering the phase transition temperature and increasing the mechanical quality factor cannot be obtained. If the content of Bi is greater than 0.850 parts by weight, the electromechanical coupling factor decreases greatly. The reduction amount in this case is comparable to 30% of a value to be obtained when Bi is not contained. Further, it is desired that the content α of Li and the content β of Bi satisfy the following formula (1).

$$0.5 \leq (\alpha \cdot MB)/(\beta \cdot ML) \leq 1 \quad \text{Formula (1)}$$

(In the formula, ML represents an atomic weight of Li and MB represents an atomic weight of Bi)

If the molar ratio between Li and Bi $[(\alpha \cdot MB)/(\beta \cdot ML)]$ is less than 0.5, the Curie temperature may decrease. If the molar ratio between Li and Bi $[(\alpha \cdot MB)/(\beta \cdot ML)]$ is greater than 1, the dielectric tangent may increase. When the molar ratio between Li and Bi is in the range defined by the formula (1), it is feasible to reduce the $T_{to}$ and $T_{ot}$ values and improve the mechanical quality factor without lowering the Curie temperature and the insulating resistance.

In the piezoelectric material according to the present invention, Li and Bi can be positioned at the grain boundary or can be dissolved in the perovskite-type structure of $(Ba,Ca)(Ti,Zr,Sn)O_3$.

When Li and Bi are positioned at the grain boundary, the friction between particles decreases and the mechanical quality factor increases. When Li and Bi are dissolved in $(Ba,Ca)(Ti,Zr,Sn)O_3$ having the perovskite structure, $T_{ot}$ and $T_{to}$ values become lower and therefore the temperature dependency in the piezoelectric constant becomes smaller in the operating temperature range. Further, the mechanical quality factor can be increased.

For example, X-ray diffraction, electron beam diffraction, electron microscope, and ICP-MS are usable to evaluate the place where Li and Bi are present.

When Li and Bi are positioned at the B site, the lattice constant of the perovskite structure increases because ion radii of Li and Bi are greater than those of Ti and Zr.

When Li and Bi are positioned at the A site, the "a" value optimum to sinter a high-density ceramics becomes smaller. In the phase diagram of BaO and $TiO_2$, a liquid phase is present at a high temperature on a $TiO_2$ rich side of a composition in which the molar ratio between BaO and $TiO_2$ is 1:1. Therefore, an abnormal grain growth occurs in the sintering of $BaTiO_3$ ceramics due to sintering in the liquid phase if the $TiO_2$ component exceeds a stoichiometric ratio. On the other hand, the density of the ceramics decreases because the sintering does not advance smoothly if the rate of BaO component is greater. When both Li and Bi components are present at the A site, the sintering of ceramics may not advance smoothly because of excessive components positioned at the A site. As a result, the density of the ceramics decreases. In such a case, it is useful to lower the "a" value to promote the sintering and obtain a high-density test piece.

For the purpose of easily manufacturing the piezoelectric material according to the present invention or adjusting physical properties of the piezoelectric material according to the present invention, it is useful to replace 1 mol % or less of Ba and Ca by a bivalent metal element (e.g., Sr). Similarly, it is useful to replace 1 mol % or less of Ti, Zr, and Sn by a tetravalent metal element (e.g., Hf).

For example, the Archimedes method is usable to measure the density of a sintered compact. In the present invention, if a relative density ($\rho_{calc.}/\rho_{meas.}$), which represents the ratio of theoretical density ($\rho_{calc.}$) to measured density ($\rho_{meas.}$), is equal to or greater than 95%, it can be regarded that the measured piezoelectric material has a sufficiently high density. The theoretical density ($\rho_{calc.}$) can be obtained with reference to composition and lattice constant of the sintered compact.

The piezoelectricity of a piezoelectric material disappears when the temperature is equal to or higher than the Curie temperature $T_C$. In the following description, $T_C$ represents the temperature at which the dielectric constant can be maximized around the phase transition temperature of a ferroelectric phase (tetragonalal phase) and a paraelectric phase (cubic phase). The dielectric constant can be measured using, for example, the impedance analyzer at the frequency of 1 kHz in a state where the AC electric field having the field intensity of 10 V/cm is applied.

The piezoelectric material according to the present invention causes sequential phase transitions to a rhombohedral, an orthorhombic, a tetragonal, and a cubic crystal when the temperature increase starts from a lower level. The phase transition referred to in the present example is limited to a phase transition from the orthorhombic to the tetragonal or a phase transition from the tetragonal to the orthorhombic. The phase transition temperature can be evaluated using a measuring method similar to that employed for the Curie temperature. The phase transition temperature refers to the temperature at which a derivative, which is obtainable by differentiating the dielectric constant by the test piece temperature, can be maximized. For example, X-ray diffraction, electron beam diffraction, and Raman scattering are usable to evaluate the crystal system.

The mechanical quality factor decreases when a domain wall vibrates. In general, the density of the domain wall increases and the mechanical quality factor decreases when the complicatedness of a domain structure increases. The crystal orientation of spontaneous polarization of an orthorhombic or tetragonal perovskite structure is <110> or <100> when expressed according to the pseudo-cubic crystal notation. More specifically, compared to an orthorhombic structure, a tetragonal structure has a lower spatial flexibility in spontaneous polarization. Therefore, the tetragonal structure is superior to the orthorhombic structure in that the domain structure becomes simple and the mechanical quality factor becomes higher even when the composition is identical. Accordingly, it is desired that the piezoelectric material according to the present invention has the tetragonal structure, rather than the orthorhombic structure, in the operating temperature range.

The dielectric constant and the electromechanical coupling factor are maximized around the phase transition temperature. On the other hand, the Young's modulus is minimized. The piezoelectric constant can be expressed as a function using the above-mentioned three parameters. The piezoelectric constant takes an extreme value or an inflection point around the phase transition temperature. Therefore, if a phase transition occurs in the operating temperature range of a device, it becomes difficult to control the device because performances of the device extremely vary depending on the temperature or the resonance frequency varies depending on the temperature. Accordingly, it is desired that the phase transition (i.e., the maximum factor that causes a variation in piezoelectric performances) is not in the operating temperature range. If the phase transition temperature deviates from the operating temperature range, the temperature dependency in piezoelectric performances decreases in the operating temperature range.

The piezoelectric material according to the present invention includes a fourth subcomponent containing Mg. It is desired that the content of the fourth subcomponent on a metal basis is equal to or less than 0.10 parts by weight (excluding 0 parts by weight) when the perovskite-type metal oxide that can be expressed using the general formula (1) is 100 parts by weight.

When the content of Mg is greater than 0.10 parts by weight, the mechanical quality factor becomes smaller (e.g., less than 600). If the piezoelectric material is used to fabricate a piezoelectric element and the fabricated element is driven as a resonance device, power consumption increases when the mechanical quality factor is small. It is desired that the mechanical quality factor is equal to or greater than 800. It is more desirable that the mechanical quality factor is equal to or greater than 1000. To obtain a more desirable mechanical quality factor, it is desired that the content of Mg is equal to or less than 0.05 parts by weight.

The form of Mg can be a Mg component contained in piezoelectric material. The form of Mg is not limited to a metal Mg. For example, Mg is soluble at the A site or the B site of the perovskite structure or can be positioned at the grain boundary. Alternatively, it is useful that a Mg component in the form of metal, ion, oxide, metal salt, or complex is contained in the piezoelectric material.

It is desired that the piezoelectric material according to the present invention includes a fifth subcomponent that contains at least one of Si and B. It is desired that the content of the fifth subcomponent on a metal basis is not less than 0.001 parts by weight and is not greater than 4.000 parts by weight when the metal oxide that can be expressed using the general formula (1) is 100 parts by weight. The fifth subcomponent has a role of lowering the sintering temperature of the piezoelectric material according to the present invention. When the piezoelectric material is incorporated in a multilayered piezoelectric element, the piezoelectric material is sintered together with an electrode material in the manufacturing process thereof. In general, the heat-resistant temperature of an electrode material is lower than that of the piezoelectric material. Therefore, if the sintering temperature of the piezoelectric material can be reduced, the energy required to sinter the piezoelectric material can be reduced and the number of employable electrode materials can be increased.

Further, Si and B are segregated at the grain boundary of the piezoelectric material. Therefore, leakage current flowing along the grain boundary reduces and the resistivity becomes higher.

When the content of the fifth subcomponent is less than 0.001 parts by weight, the effect of lowering the sintering temperature cannot be obtained. When the content of the fifth subcomponent is greater than 4.000 parts by weight, the dielectric constant decreases and, as a result, the piezoelectricity decreases. When the content of the fifth subcomponent is not less than 0.001 parts by weight and is not greater than 4.000 parts by weight, the reduction of piezoelectricity can be suppressed to 30% or less and the sintering temperature can be reduced. In particular, it is more desirable to set the content of the fifth subcomponent to be not less than 0.05 parts by weight because sintering a high-density ceramics at a sintering temperature lower than 1250° C. becomes feasible. Further, it is more desirable to set the content of the fifth subcomponent to be not less than 0.09 parts by weight and not greater than 0.15 parts by weight because the sintering can be performed at 1200° C. or less and the reduction of piezoelectricity can be suppressed to 20% or less.

It is desired that the piezoelectric material according to the present invention satisfies a relationship $0.19<2.15\alpha+1.11\beta<1$ in the general formula (1). When the contents $\alpha$ and $\beta$ satisfy the above-mentioned relationship, the mechanical quality factor of the piezoelectric material becomes higher compared to a value obtained when the contents $\alpha$ and $\beta$ do not satisfy the above-mentioned relationship.

If further improvement of the mechanical quality factor is required, it is desired that a relationship $0.111<2.15\alpha+1.11\beta<0.333$ is satisfied in the general formula (1).

It is desired that the piezoelectric material according to the present invention satisfies a relationship $y+z \leq (11x/14)-0.037$ in the general formula (1). When x, y, and z satisfy the above-mentioned relationship, the phase transition temperature $T_{to}$ becomes lower than $-20°$ C. and the temperature dependency in the piezoelectric constant becomes smaller in the operating temperature range.

It is desired that the Curie temperature of the piezoelectric material according to the present invention is equal to or higher than 100° C. When the Curie temperature is equal to or higher than 100° C., the piezoelectric material according to the present invention can possess a stable piezoelectric constant and an adequate mechanical quality factor while maintaining the piezoelectricity satisfactorily even in a severe temperature condition comparable to the temperature inside a vehicle (e.g., 80° C.) in the summer season.

A method for manufacturing the piezoelectric material according to the present invention is not specifically limited.

In manufacturing a piezoelectric ceramics, a general method including sintering a solid powder (e.g., oxide, carbonate, nitrate, or oxalate) containing constituent elements under a normal pressure is employable. Appropriate metal compounds, such as Ba compound, Ca compound, Ti compound, Zr compound, Sn compound, Mn compound, Li compound, and Bi compound, are usable as raw materials for the piezoelectric material according to the present invention.

For example, barium hydroxide, barium carbonate, barium oxalate, barium acetate, barium nitrate, barium titanate, barium zirconate, and barium titanate zirconate are Ba compounds usable in the present invention.

For example, calcium oxide, calcium carbonate, calcium oxalate, calcium acetate, calcium titanate, and calcium zirconate are Ca compounds usable in the present invention.

For example, titanium oxide, barium titanate, barium titanate zirconate, and calcium titanate are Ti compounds usable in the present invention.

For example, zirconium oxide, barium zirconate, barium titanate zirconate, and calcium zirconate are Zr compounds usable in the present invention.

For example, tin oxide, barium stannate, and calcium stannate are Sn compounds usable in the present invention.

For example, manganese carbonate, manganese monoxide, manganese dioxide, tetramanganese trioxide, and manganese acetate are Mn compounds usable in the present invention.

For example, lithium carbonate and lithium bismuthic acid are Li compounds usable in the present invention.

For example, bismuth oxide and lithium bismuthic acid are Bi compounds usable in the present invention.

Further, a raw material to be required to adjust "a" {a=(Ba+Ca)/(Zr+Ti+Sn)} representing the ratio of the total mole number of Ba and Ca to the total mole number of Ti, Zr, and Sn of the piezoelectric ceramics according to the present invention is not specifically limited. Each of the above-mentioned Ba compounds, Ca compounds, Ti compounds, Zr compounds, and Sn compounds brings similar effects.

A method for granulating the raw material powder for the piezoelectric ceramics according to the present invention is not specifically limited. A binder usable in the granulation is, for example, polyvinyl alcohol (PVA), polyvinyl butylal (PVB), or acrylic resin. It is desired that the addition amount of the binder is in a range from 1 parts by weight to 10 parts by weight. Further, it is desired to set the addition amount of the binder to be in a range from 2 parts by weight to 5 parts by weight because the molding density can be increased. It is useful to granulate a mixed powder that can be obtained by mechanically mixing the above-mentioned Ba compound, Ca compound, Ti compound, Zr compound, Sn compound, and Mn compound. It is also useful to calcinate the above-mentioned compounds in a temperature range of 800 to 1300° C. before these compounds are granulated. Further, it is useful to add the Mn compound and a binder simultaneously to the calcinated mixture of the above-mentioned Ba compound, Ca compound, Ti compound, Zr compound, Sn compound, Li compound, and Bi compound. Further, if it is required to obtain a granulated powder having a uniform grain diameter, the most desirable granulation method is a spray-dry method.

A method for fabricating the piezoelectric ceramics compact according to the present invention is not specifically limited. The compact is a solid body that can be fabricated from a raw material powder, a granulated powder, or slurry. The fabrication of the compact can be realized, for example, by uniaxial pressurization working, cold hydrostatic pressure working, warm hydrostatic pressure working, cast molding, or extrusion molding.

A method for sintering the piezoelectric ceramics according to the present invention is not specifically limited. The sintering method is, for example, a sintering method using an electric furnace, a sintering method using a gas furnace, an electric heating method, a microwave sintering method, a milliwave sintering method, or a hot isotropic press (HIP). The electric furnace based sintering and the gas furnace based sintering can be realized by a continuous furnace or a batch furnace.

The above-mentioned sintering method does not specifically limit the sintering temperature of the ceramics. However, it is desired that the sintering temperature is sufficient to cause each compound to react and cause the crystal to grow. If the ceramics is required to have a grain diameter of 3 μm to 30 μm, the desirable sintering temperature is not lower than 1100° C. and is not higher than 1550° C. It is more desirable to set the sintering temperature to be not lower than 1100° C. and not higher than 1380° C. The piezoelectric ceramics having been sintered in the above-mentioned temperature range demonstrates satisfactory piezoelectric performances.

If it is required to constantly stabilize the characteristics of a piezoelectric ceramics obtained through the sintering processing, it is desired that the sintering time is not shorter than two hours and not longer than 24 hours under a condition that the sintering temperature is maintained within the above-mentioned range.

Although a conventionally known sintering method (e.g., the two-step sintering method) is employable, it is useful to select an appropriate method that does not cause any abrupt change in the temperature when the productivity is taken into consideration.

When the piezoelectric ceramics is subjected to a polish working, it is desired that the piezoelectric ceramics is subsequently subjected to a heat treatment at 1000° C. or higher. When the piezoelectric ceramics is mechanically polished, a significant residual stress is generated in the piezoelectric ceramics. However, the residual stress can be reduced by performing the heat treatment at 1000° C. or higher. The piezoelectric characteristics of the piezoelectric ceramics can be further improved. Further, performing the above-mentioned heat treatment is effective to remove the raw material powder (including barium carbonate) that may deposit along the grain boundary portion. Although the time required to complete the heat treatment is not specifically limited, it is desired that the heat treatment time is equal to or greater than one hour.

If the crystal grain diameter of the piezoelectric material according to the present invention exceeds 50 μm, the material strength may be insufficient for a cut working and a polish working. Further, the piezoelectricity deteriorates if the grain diameter is less than 0.3 μm. Accordingly, it is desired that an average grain diameter range is not less than 0.3 μm and is not greater than 50 μm. It is more desirable that the grain diameter range is not less than 3 μm and is not greater than 30 μm.

In the present invention, the "grain diameter" is a "projected area diameter" that is generally referred to in a microscopic observation method. More specifically, the "grain diameter" represents the diameter of a perfect circle that has an area comparable to the projected area of the crystal grain. A method for measuring the grain diameter according to the present invention is not specifically limited. For example, the grain diameter can be obtained by performing image processing on a photographic image of a surface of a piezoelectric material that can be captured by a polarizing microscope or a scanning electron microscope. It may be useful to selectively use either the optical microscope or the electron microscope because the optimum magnification is variable depending on the diameter of a target particle. It is also useful to obtain an equivalent circle diameter based an image of a polished surface or a cross section of the material.

When the piezoelectric material according to the present invention is used to fabricate a film on a substrate, it is desired that the thickness of the piezoelectric material is not less than 200 nm and is not greater than 10 μm. It is more desirable that the thickness of the piezoelectric material is not less than 300 nm and is not greater than 3 μm. When the film thickness of the piezoelectric material is not less than 200 nm and is not greater than 10 μm, the piezoelectric element can possess a sufficient electromechanical transducing function.

A film forming method is not specifically limited. For example, a chemical solution deposition (CSD) method, a sol-gel method, a metal organic chemical vapor deposition (MOCVD) method, a sputtering method, a pulsed laser deposition (PLD) method, a hydrothermal method, an aerosol deposition (AD) method are usable to form a film. When the film to be formed is a multilayered film, the most desirable method selectable from the above-mentioned methods is the chemical solution deposition method or the sputtering method. The chemical solution deposition method or the sputtering method is preferably used to form a film having a large area. A monocrystal substrate being cut and polished along a (001) or (110) plane is preferably used as a substrate of the piezoelectric material according to the present invention. Using the monocrystal substrate being cut and polished along a specific crystal plane is useful in that a piezoelectric material film to be provided on a substrate surface can be strongly orientated in the same direction.

Hereinafter, a piezoelectric element using the piezoelectric material according to the present invention is described in detail below.

FIG. 1 schematically illustrates a configuration of the piezoelectric element according to an embodiment of the present invention. The piezoelectric element according to the present invention includes a first electrode 1, a piezoelectric material portion 2, and a second electrode 3. The piezoelectric element is characterized in that the piezoelectric material portion 2 is constituted by the piezoelectric material according to the present invention.

When the piezoelectric material according to the present invention is incorporated into a piezoelectric element including at least the first electrode and the second electrode, the piezoelectric element can possess evaluable piezoelectric characteristics. Each of the first electrode and the second electrode is an electrically conductive layer having a thickness of 5 nm to 10 μm. The material of the first and second electrodes is not specifically limited and can be any material ordinarily usable for piezoelectric elements. For example, metals such as Ti, Pt, Ta, Ir, Sr, In, Sn, Au, Al, Fe, Cr, Ni, Pd, Ag, and Cu and their compounds are usable.

Each of the first electrode and the second electrode can be formed as a single layer made of only one material selected from the above-mentioned examples or can be formed as a multilayered electrode including at least two materials. Further, the material of the first electrode can be differentiated from the material of the second electrode.

The method for manufacturing the first electrode and the second electrode is not specifically limited. For example, the manufacturing method can include baking a metal paste. Further, the sputtering method or the vapor deposition method is usable. Further, patterning the first electrode and the second electrode into desired shapes is also useful.

It is more desirable that polarization axes of the piezoelectric element are uniformly oriented in a predetermined direction. When the polarization axes are uniformly oriented in the predetermined direction, the piezoelectric constant of the piezoelectric element becomes greater.

A method for polarizing the piezoelectric element is not specifically limited. The polarization processing can be performed in the atmosphere or can be performed in a silicone oil. It is desired that the polarization temperature is in a range from 60° C. to 150° C. However, optimum conditions are slightly variable depending on actual compositions of a piezoelectric material that is employed to constitute an element. Further, it is desired that the electric field to be applied in the polarization processing is in a range from 600 V/mm to 2.0 kV/mm.

The piezoelectric constant and the electromechanical quality factor of the piezoelectric element can be calculated based on measurement results of the resonance frequency and the antiresonance frequency obtained by a commercially available impedance analyzer, with reference to standards of Japan Electronics and Information Technology Industries Association (JEITA EM-4501). Hereinafter, the above-mentioned method is referred to as a resonant-antiresonant method.

Next, a multilayered piezoelectric element that can be fabricated using the piezoelectric material according to the present invention is described in detail below.

<Multilayered Piezoelectric Element>

The multilayered piezoelectric element according to the present invention is a multilayered piezoelectric element that includes a plurality of piezoelectric material layers and a plurality of electrodes including at least one internal electrode, which are alternately multilayered. The piezoelectric material layer that constitutes the multilayered piezoelectric element is characterized by being made of the piezoelectric material according to the present invention.

Figure 2A:
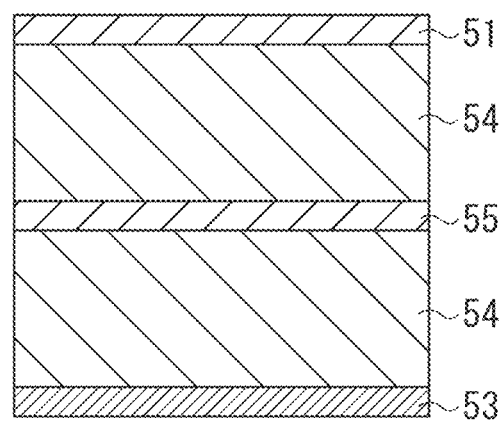
FIGS. 2A and 2B are cross-sectional views schematically illustrating example configurations of a multilayered piezoelectric element according to an embodiment of the present invention.
Figure 2B:
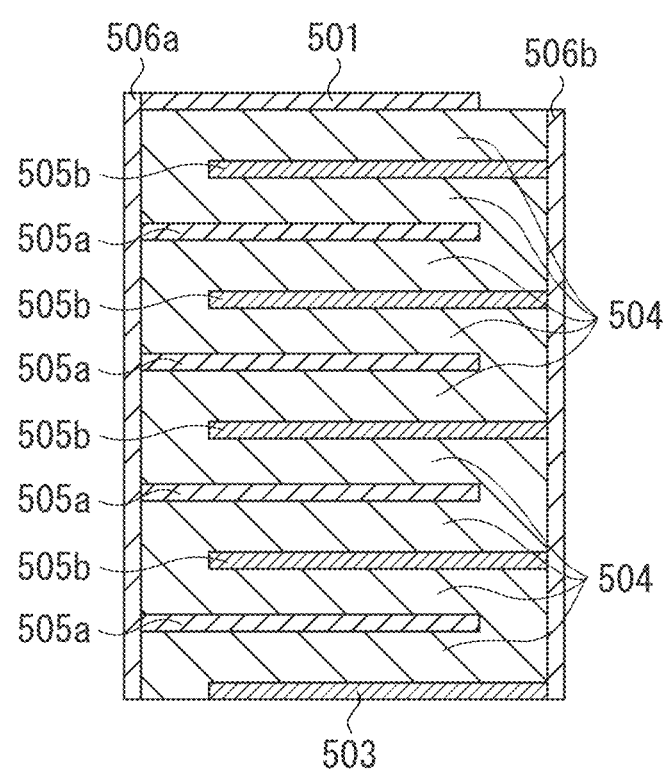

FIGS. 2A and 2B are cross-sectional views schematically illustrating example configurations of the multilayered piezoelectric element according to an embodiment of the present invention. The multilayered piezoelectric element according to the present invention includes piezoelectric material layers 54 and electrodes including an internal electrode 55. In other words, the multilayered piezoelectric element according to the present invention is characterized by including piezoelectric material layers and at least one layered electrode that are alternately multilayered and the piezoelectric material layer 54 is made of the above-mentioned piezoelectric material. The electrodes of the multilayered piezoelectric element can include external electrodes, such as a first electrode 51 and a second electrode 53, in addition to the internal electrode 55.

FIG. 2A illustrates an example of the multilayered piezoelectric element according to the present invention, which includes two piezoelectric material layers 54 and a single internal electrode 55 that are alternately multilayered in such a way as to constitute a multilayered structure sandwiched between the first electrode 51 and the second electrode 53. The number of the piezoelectric material layers and the internal electrodes can be increased as illustrated in FIG. 2B. The number of constituent layers is not limited to a specific value. The multilayered piezoelectric element illustrated in FIG. 2B includes nine piezoelectric material layers 504 and eight internal electrodes 505 that are alternately multilayered in such a way as to constitute a multilayered structure sandwiched between the first electrode 501 and the second electrode 503. The multilayered piezoelectric element illustrated in FIG. 2B further includes two external electrodes 506a and 506b that electrically connect the alternately disposed internal electrodes.

The internal electrodes 55 and 505 and the external electrodes 506a and 506b are not always similar to the piezoelectric material layers 54 and 504 in size and shape. Each electrode can be further divided into a plurality of subelectrodes.

Each of the internal electrodes 55 and 505, the external electrodes 506a and 506b, the first electrodes 51 and 501, and the second electrodes 53 and 503 is constituted by an electrically conductive layer having a thickness of 5 nm to 10 μm. The material of each electrode is not specifically limited and can be an ordinary material that can be used for a piezoelectric element. For example, metals such as Ti, Pt, Ta, Ir, Sr, In, Sn, Au, Al, Fe, Cr, Ni, Pd, Ag, and Cu and their compounds are usable as the electrode constituting the multilayered piezoelectric element. One material or a mixture (or an alloy) containing two or more materials selected from the above-mentioned group can be used as the internal electrodes 55 and 505 and the external electrodes 506a and 506b. Further, two or more materials selected form the above-mentioned group can be multilayered. Further, a plurality of electrodes can be made of mutually different materials. When the cheapness of the electrode material is taken into consideration, it is desired that the internal electrodes 55 and 505 include at least one of Ni and Cu components. When the internal electrodes 55 and 505 use at least one of Ni and Cu components, it is desired that the multilayered piezoelectric element according to the present invention is sintered in a reducing atmosphere.

In the multilayered piezoelectric element according to the present invention, it is desired that the internal electrode includes Ag and Pd and a relationship $0.25 \leq M1/M2 \leq 4.0$ is satisfied with respect to weight ratio M1/M2, in which M1 represents the content of Ag and M2 represents the content of Pd. It is not desired to set the weight ratio M1/M2 to be less than 0.25 because the sintering temperature of the internal electrode becomes higher. Further, it is not desired to set the weight ratio M1/M2 to be greater than 4.0 because the internal electrode becomes an island shape. In other words, the internal electrode surface becomes ununiform. It is more desirable that a relationship $0.3 \leq M1/M2 \leq 3.0$ is satisfied with respect to the weight ratio M1/M2.

As illustrated in FIG. 2B, a plurality of electrodes including the internal electrode 505 can be electrically connected to each other to equalize the driving voltage phase. For example, each internal electrode 505a can be electrically connected to the first electrode 501 via the external electrode 506a. Each internal electrode 505b can be electrically connected to the second electrode 503 via the external electrode 506b. The internal electrodes 505a and the internal electrodes 505b can be alternately disposed. Further, the way of electrically connecting electrodes is not limited to a specific structure. For example, it is useful to provide a dedicated electrode or wiring on a side surface of the multilayered piezoelectric element to realize a comparable electrical connection between electrodes. It is also useful to provide a through-hole that extends across a plurality of piezoelectric material layers and fill the inside space thereof with an electrically conductive material to realize a comparable electrical connection between electrodes.

<Liquid Discharge Head>

A liquid discharge head according to the present invention is characterized by a liquid chamber that is equipped with a vibrating unit in which the above-mentioned piezoelectric element or the above-mentioned multilayered piezoelectric element is disposed and a discharge port that communicates with the liquid chamber. The liquid to be discharged from the liquid discharge head according to the present invention is not limited to a specific fluid. For example, the liquid discharge head according to the present invention can discharge aqueous liquid (e.g., water, ink, or fuel) or non-aqueous liquid.

Figure 3A:
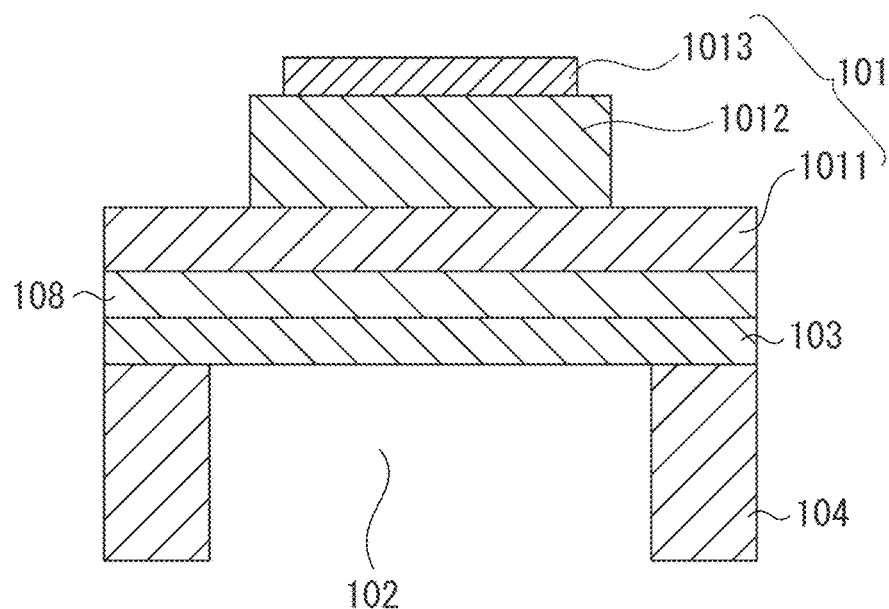
FIGS. 3A and 3B schematically illustrate a configuration of a liquid discharge head according to an embodiment of the present invention.
Figure 3B:
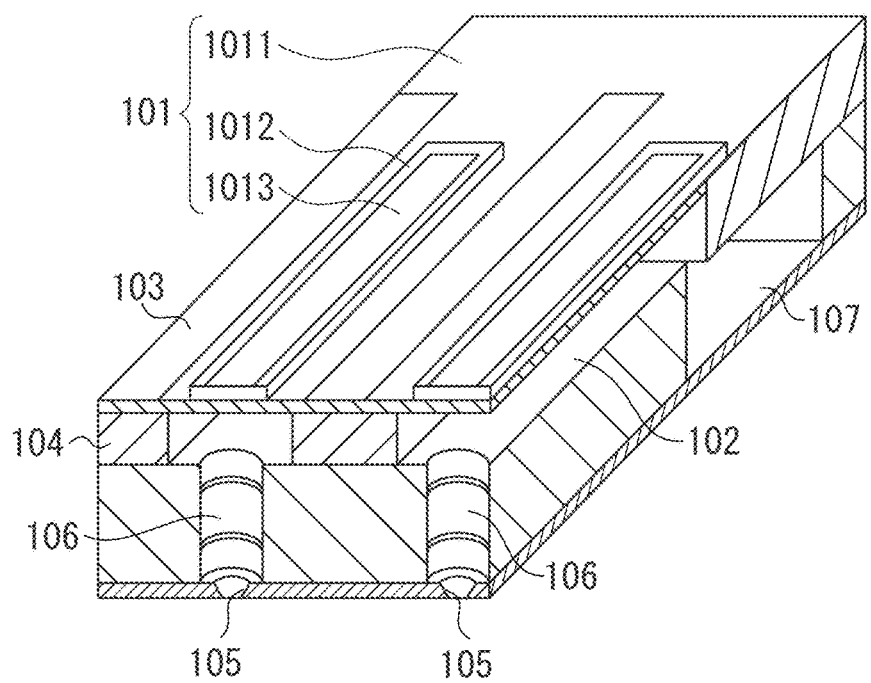

FIGS. 3A and 3B schematically illustrate a configuration of the liquid discharge head according to an embodiment of the present invention. As illustrated in FIGS. 3A and 3B, the liquid discharge head according to the present invention includes a piezoelectric element 101 according to the present invention. The piezoelectric element 101 includes a first electrode 1011, a piezoelectric member 1012, and a second electrode 1013. The piezoelectric member 1012 is formed as a patterning, if necessary, as illustrated in FIG. 3B.

FIG. 3B is a schematic diagram illustrating a liquid discharge head. The liquid discharge head includes a plurality of discharge ports 105, individual liquid chambers 102, continuous holes 106 each connecting the individual liquid chamber 102 to the corresponding discharge port 105, a liquid chamber bulkhead 104, a common liquid chamber 107, a vibration plate 103, and the piezoelectric element 101. The piezoelectric element 101 illustrated in FIGS. 3A and 3B has a rectangular shape. However, the piezoelectric element 101 can be configured to have an elliptic, circular, or parallelogrammatic shape. In general, the piezoelectric member 1012 has a shape similar to that of the individual liquid chamber 102.

A peripheral structure of the piezoelectric element 101 included in the liquid discharge head according to the present invention is described in detail below with reference to FIG. 3A. FIG. 3A is a cross-sectional view of the piezoelectric element illustrated in FIG. 3B, taken along the width direction. The cross-sectional shape of the piezoelectric element 101 is not limited to an illustrated rectangular shape and can be a trapezoidal or reverse trapezoidal shape.

In FIGS. 3A and 3B, the first electrode 1011 serves as a lower electrode and the second electrode 1013 serves as an upper electrode. However, the first electrode 1011 and the second electrode 1013 are not limited the above-mentioned arrangement. For example, the first electrode 1011 can be used as the upper electrode and the second electrode 1013 can be used as the lower electrode. Further, it is useful to provide a buffer layer 108 between the vibration plate 103 and the lower electrode. The above-mentioned differences in the names to be referred to are dependent on the manufacturing method of an individual device. In any case, effects of the present invention can be obtained.

In the liquid discharge head, the vibration plate 103 moves in the up-and-down direction in response to an expansion/contraction motion of the piezoelectric member 1012 in such a way as to pressurize the liquid in the individual liquid chamber 102. As a result, the liquid can be discharged from the discharge port 105. The liquid discharge head according to the present invention can be incorporated into a printer and can be used in the manufacturing of an electronic device. The thickness of the vibration plate 103 is not less than 1.0 μm and is not greater than 15 μm. It is desired to set the thickness of the vibration plate 103 to be not less than 1.5 μm and not greater than 8 μm. It is desired that the vibration plate is made of Si, although the material of the vibration plate is not limited to a specific material. Further, the vibration plate can be configured as a boron (or phosphorus) doped vibration plate if the vibration plate contains Si. Further, the buffer layer and the electrode provided on the vibration plate can be configured as a part of the vibration plate. The thickness of the buffer layer 108 is not less than 5 nm and is not greater than 300 nm. It is desired to set the thickness of the buffer layer 108 to be not less than 10 nm and is not greater than 200 nm. The size of the discharge port 105 is not less than 5 μm and is not greater than 40 μm, when measured as an equivalent circle diameter. The discharge port 105 can be configured to have a circular shape, a star shape, a rectangular shape, or a triangular shape.

<Liquid Discharge Apparatus>

Next, a liquid discharge apparatus according to the present invention is described in detail below. The liquid discharge apparatus according to the present invention includes a portion on which an image transferred medium is placed and the above-mentioned liquid discharge head.

Figure 4:
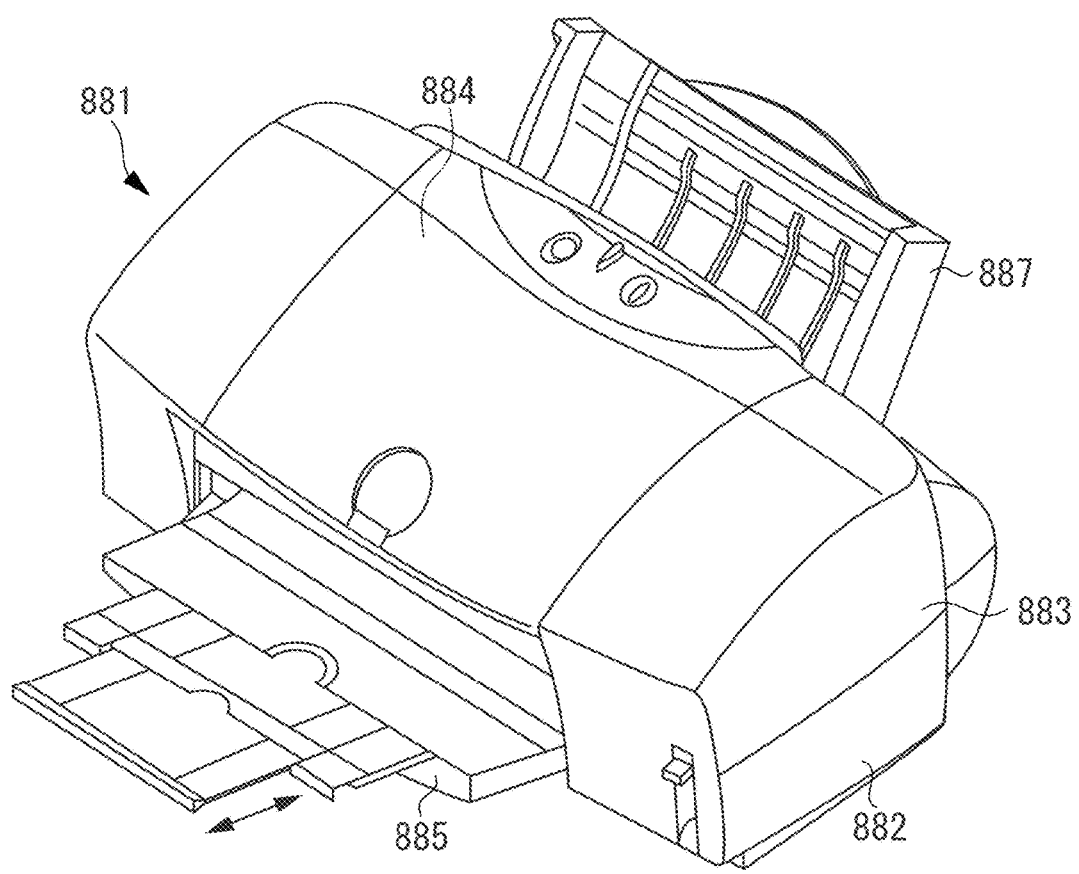
FIG. 4 schematically illustrates a liquid discharge apparatus according to anembodiment of the present invention.
Figure 5:
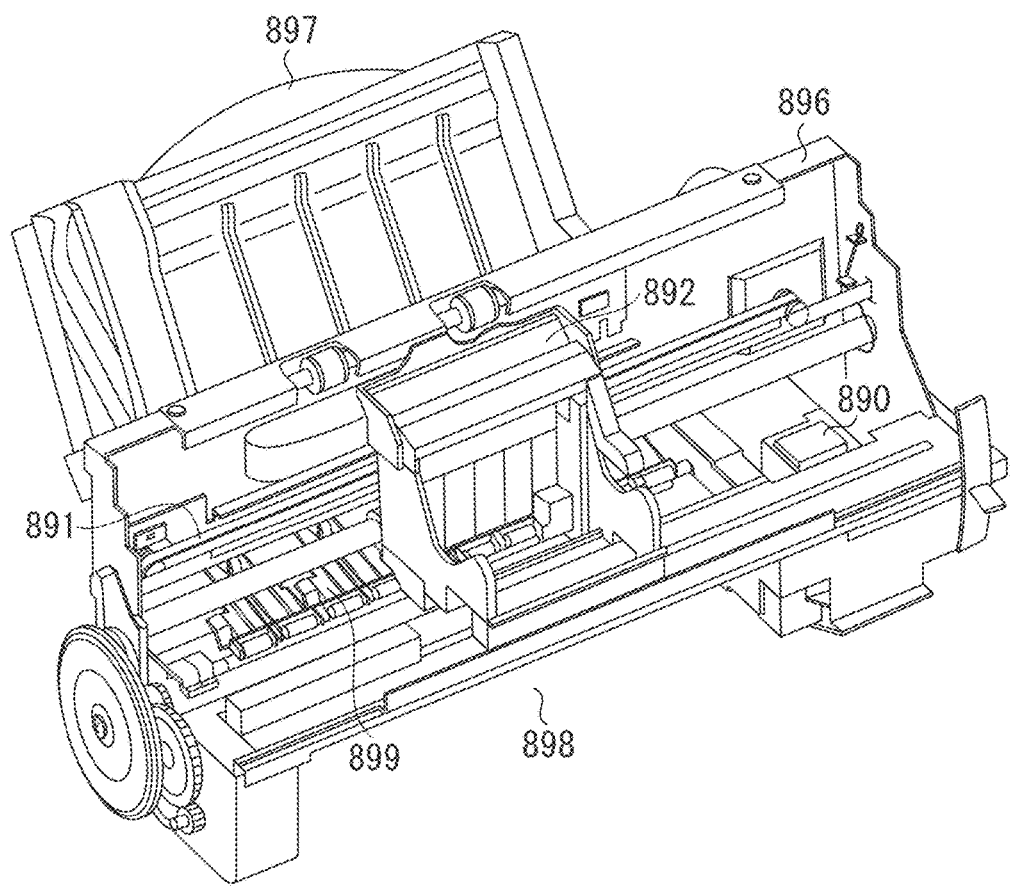
FIG. 5 schematically illustrates the liquid discharge apparatus according to anembodiment of the present invention.

FIGS. 4 and 5 illustrate an inkjet recording apparatus as an example of the liquid discharge apparatus according to the present invention. FIG. 5 illustrates a state where exterior parts 882 to 885 and 887 are removed from a liquid discharge apparatus (i.e., an inkjet recording apparatus) 881 illustrated in FIG. 4. The inkjet recording apparatus 881 includes an automatic feeding unit 897 that can automatically feed a recording paper (i.e., the image transferred medium) into an apparatus main body 896. Further, the inkjet recording apparatus 881 includes a conveyance unit 899 that can guide a recording paper fed from the automatic feeding unit 897 to a predetermined recording position and further guide the recording paper from the recording position to an outlet port 898. The inkjet recording apparatus 881 further includes a recording unit 891 that can perform recording on the recording paper conveyed to the recording position and a recovery unit 890 that can perform recovery processing for the recording unit 891. The recording unit 891 includes a carriage 892 in which the liquid discharge head according to the present invention is placed in such a way as to move along a rail.

In the above-mentioned inkjet recording apparatus, the carriage 892 moves along the rail in response to an electric signal supplied from a computer and the piezoelectric material causes a displacement when a driving voltage is applied to electrodes that sandwich the piezoelectric material. The displacement of the piezoelectric material presses the individual liquid chamber 102 via the vibration plate 103 illustrated in FIG. 3B to discharge an ink from the discharge port 105 to perform printing. The liquid discharge apparatus according to the present invention can uniformly discharge liquid at a higher speed and can downsize the apparatus body.

The liquid discharge apparatus according to the present invention is not limited to the above-mentioned printer and can be configured as a facsimile machine, a multifunction peripheral, a copy machine, or any other printing apparatus. Further, the liquid discharge apparatus according to the present invention can be configured as an industrial liquid discharge apparatus or a target drawing apparatus.

In addition, a user can select a desired image transferred medium according to an intended purpose. The liquid discharge head can move relative to an image transferred medium placed on a stage that serves as the image transferred medium placement portion.

<Ultrasonic Motor>

Figure 6A:
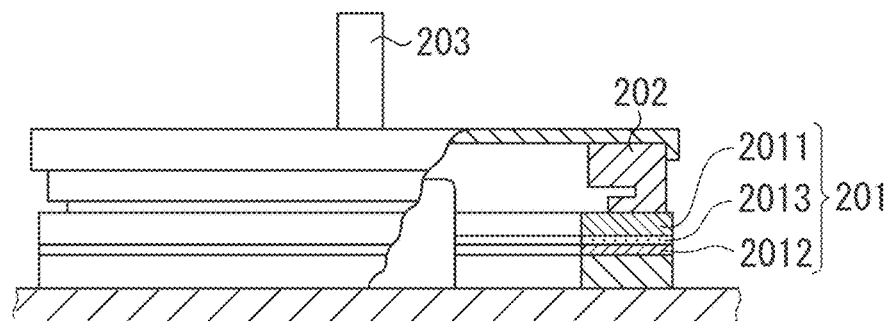
FIGS. 6A and 6B schematically illustrate a configuration of an ultrasonic motor according to an embodiment of the present invention.
Figure 6B:
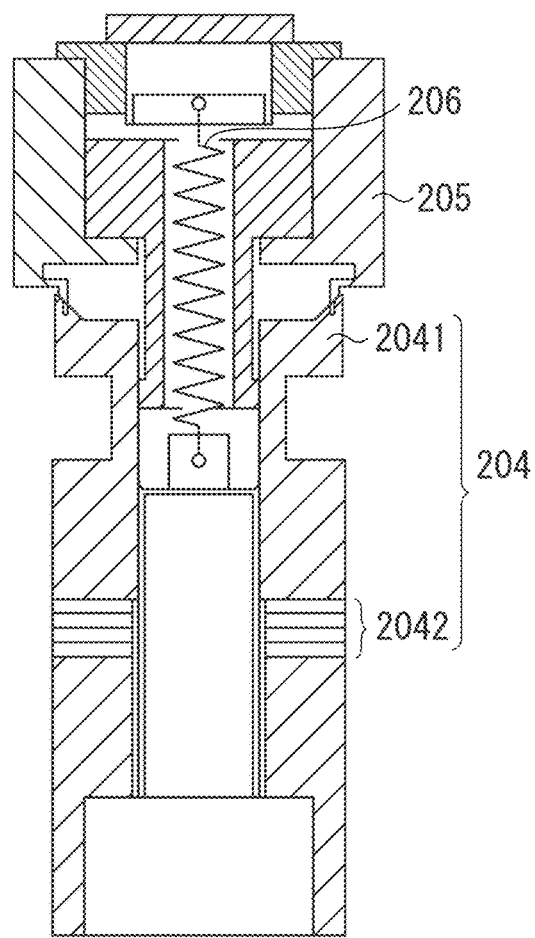

An ultrasonic motor according to the present invention is characterized by a vibrating body in which the above-mentioned piezoelectric element or the above-mentioned multilayered piezoelectric element is disposed and a moving body that contacts the vibrating body. FIGS. 6A and 6B schematically illustrate configuration examples of the ultrasonic motor according to an embodiment of the present invention. FIG. 6A illustrates an example of the ultrasonic motor that includes a single-plate type piezoelectric element according to the present invention. The ultrasonic motor illustrated in FIG. 6A includes an oscillator 201, a rotor 202 contacting a sliding surface of the oscillator 201 under a pressing force applied by a compression spring (not illustrated), and an output shaft 203 integrally formed with the rotor 202. The oscillator 201 includes an elastic metal ring 2011, a piezoelectric element 2012 (i.e., a piezoelectric element according to the present invention), and an organic adhesive 2013 (e.g., an epoxy type or a cyanoacrylate type) that connects the piezoelectric element 2012 to the elastic ring 2011. The piezoelectric element 2012 according to the present invention is constituted by a piezoelectric material sandwiched by a first electrode (not illustrated) and a second electrode (not illustrated). When two-phase alternating voltages having a phase difference comparable to odd times of $\pi/2$ is applied to the piezoelectric element according to the present invention, a curved traveling wave appears on the oscillator 201 and each point on the sliding surface of the oscillator 201 causes an elliptic motion. If the rotor 202 is pressed against the sliding surface of the oscillator 201, the rotor 202 receives a frictional force from the oscillator 201 and rotates in a direction opposed to the curved traveling wave. A driven member (not illustrated) is connected to the output shaft 203 and is driven by a rotational force of the rotor 202. A piezoelectric transversal effect obtainable when a voltage is applied to a piezoelectric material causes the piezoelectric material to stretch. In a case where an elastic body (e.g., a metallic member) is connected to a piezoelectric element, the elastic body is bent in accordance with an expansion and contraction motion of the piezoelectric material. The ultrasonic motor illustrated in FIG. 6A is operable based on the above-mentioned principle. FIG. 6B illustrates another example of the ultrasonic motor that includes a piezoelectric element having a multilayered structure. An oscillator 204 includes a multilayered piezoelectric element 2042 sandwiched between cylindrical elastic metal bodies 2041. The multilayered piezoelectric element 2042 is constituted by a plurality of multilayered piezoelectric materials (not illustrated). The multilayered piezoelectric element 2042 includes a first electrode and a second electrode formed on outer surfaces of the multilayered body and an internal electrode provided in the multilayered body. The elastic metal bodies 2041 are tightened by means of bolts to firmly hold the piezoelectric element 2042 between them in such a way as to constitute the oscillator 204. If alternating voltages having a phase difference therebetween are applied to the piezoelectric element 2042, the oscillator 204 generates two types of vibrations that are mutually perpendicular. The above-mentioned vibrations, when combined together, can drive a front end portion of the oscillator 204 and therefore can form a circular vibration. A circular groove is formed at an upper part of the oscillator 204 so that the vibratory displacement can be increased. A pressing spring 206 presses the rotor 205 against the oscillator 204 to obtain a driving frictional force. The rotor 205 is rotatable and supported by a bearing.

<Optical Device>

Next, an optical device according to the present invention is described in detail below. The optical device according to the present invention is characterized by a driving unit that includes the ultrasonic motor.

Figure 7A:
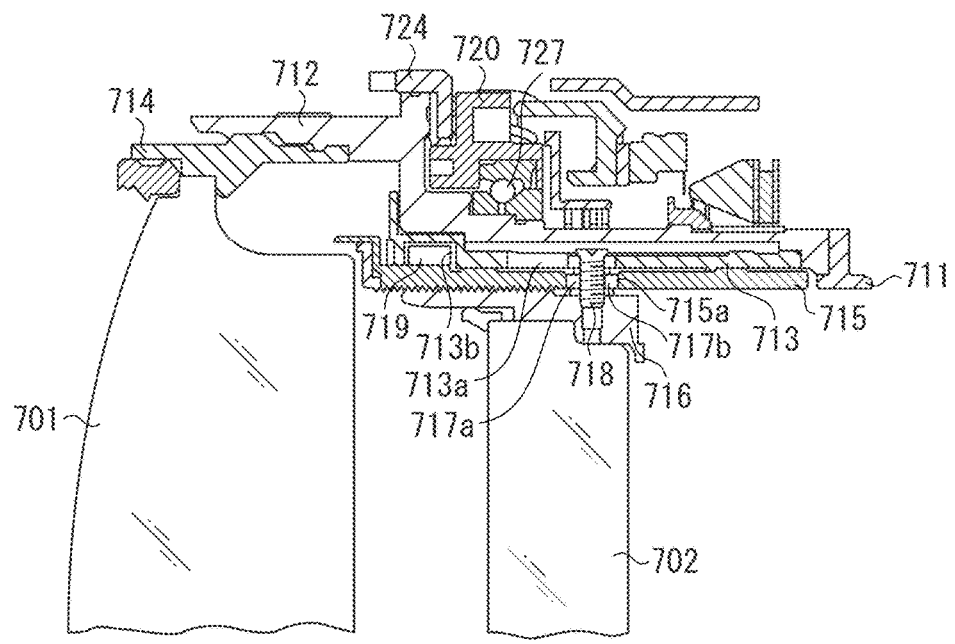
FIGS. 7A and 7B schematically illustrate an optical device according to an embodiment of the present invention.
Figure 7B:
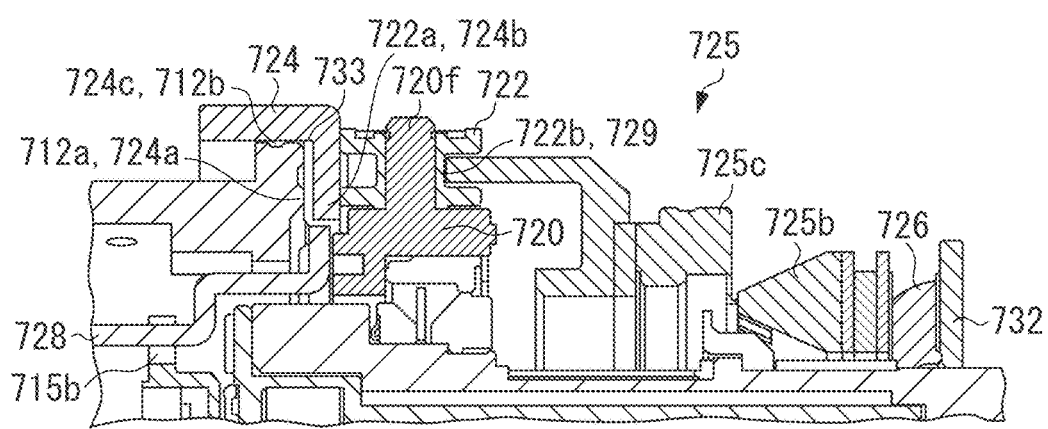
Figure 8:
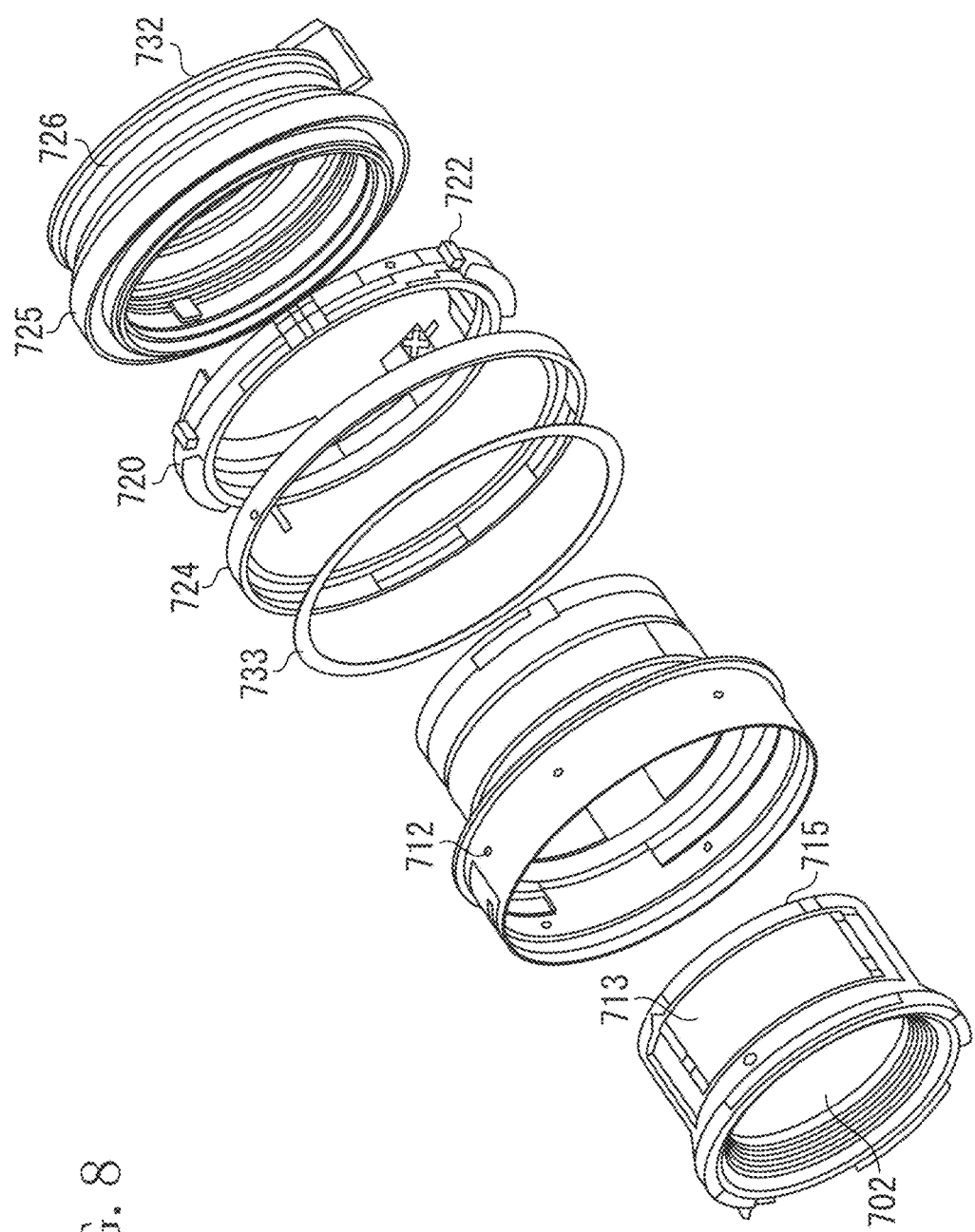
FIG. 8 schematically illustrates the optical device according to an embodiment of the present invention.

FIG. 7 is an essential cross-sectional view illustrating an interchangeable lens barrel of a single lens reflex camera, as an example of the optical device according to an embodiment of the present invention. FIG. 8 is an exploded perspective view illustrating the interchangeable lens barrel of the single lens reflex camera, as an example of the optical device according to a preferred embodiment of the present invention. A fixed barrel 712, a rectilinear guide barrel 713, and a front group lens barrel 714 (i.e., fixing members of the interchangeable lens barrel) are fixed to a camera detachment mount 711.

A rectilinear guide groove 713a extending in the optical axis direction of a focus lens 702 is formed on the rectilinear guide barrel 713. An axial screw 718 fixes cam rollers 717a and 717b to a rear group lens barrel 716 that holds the focus lens 702. Each of the cam rollers 717a and 717b protrudes outwardly in the radial direction. The cam roller 717a is coupled with the rectilinear guide groove 713a.

A cam ring 715 is rotatable and coupled with an inner surface of the rectilinear guide barrel 713. A relative movement between the rectilinear guide barrel 713 and the cam ring 715 in the optical axis direction is regulated when a roller 719 fixed to the cam ring 715 is coupled with a circular groove 713b of the rectilinear guide barrel 713. A cam groove 715a dedicated to the focus lens 702 is formed on the cam ring 715. The above-mentioned cam roller 717*b* is simultaneously coupled with the cam groove 715*a*.

A rotation transmission ring 720 is disposed on an outer surface of the fixed barrel 712. A ball race 727 holds the rotation transmission ring 720 in such a way as to be rotatable relative to the fixed barrel 712 at a predetermined position. A roller 722, which is freely rotatable, is held by a shaft 720*f* that radially extends from the rotation transmission ring 720. A large-diameter portion 722*a* of the roller 722 is brought into contact with a mount side surface 724*b* of a manual focus ring 724. Further, a small-diameter portion 722*b* of the roller 722 is brought into contact with a joint member 729. Six rollers 722, each having the above-mentioned configuration, are disposed at equal intervals around an outer surface of the rotation transmission ring 720.

A low-friction sheet (e.g., a washer member) 733 is disposed at an inner cylindrical portion of the manual focus ring 724. The low-friction sheet is sandwiched between a mount end surface 712*a* of the fixed barrel 712 and a front end surface 724*a* of the manual focus ring 724. Further, an outer cylindrical surface of the low-friction sheet 733 has a ring shape and is radially coupled with an inner diameter portion 724*c* of the manual focus ring 724. Further, the inner diameter portion 724*c* of the manual focus ring 724 is radially coupled with an outer-diameter portion 712*b* of the fixed barrel 712. The low-friction sheet 733 has a role of reducing the friction in a rotary ring mechanism in which the manual focus ring 724 is configured to rotate around the optical axis relative to the fixed barrel 712.

A wave washer 726 presses an ultrasonic motor 725 toward the front side of the lens. The pressing force of the wave washer 726 can hold the large-diameter portion 722*a* of the roller 722 and the mount side surface 724*b* of the manual focus ring 724 in the contact state. Similarly, the force of the wave washer 726 pressing the ultrasonic motor 725 toward the front side of the lens can appropriately press the small-diameter portion 722*b* of the roller 722 against the joint member 729 so as to maintain the contact state. A washer 732, which is connected to the fixed barrel 712 by bayonet coupling, regulates the wave washer 726 when it moves in the mount direction. A spring force (i.e., a biasing force) generated by the wave washer 726 can be transmitted to the ultrasonic motor 725 and further to the roller 722. The transmitted force causes the manual focus ring 724 to press the mount end surface 712*a* of the fixed barrel 712. More specifically, in the incorporated state, the manual focus ring 724 is pressed against the mount end surface 712*a* of the fixed barrel 712 via the low-friction sheet 733.

Accordingly, when a control unit (not illustrated) drives the ultrasonic motor 725 to cause a rotation relative to the fixed barrel 712, the roller 722 rotates around the central axis of the shaft 720*f* because the joint member 729 frictionally contacts the small-diameter portion 722*b* of the roller 722. When the roller 722 rotates around the shaft 720*f*, the rotation transmission ring 720 rotates around the optical axis (which is referred to as an auto-focusing operation).

Further, if a rotational force around the optical axis is given to the manual focus ring 724 from a manual operation input unit (not illustrated), the roller 722 rotates around the shaft 720*f* due to a frictional force because the mount side surface 724*b* of the manual focus ring 724 is pressed against the large-diameter portion 722*a* of the roller 722. When the large-diameter portion 722*a* of the roller 722 rotates around the shaft 720*f*, the rotation transmission ring 720 rotates around the optical axis. In this case, a friction holding force acting between a rotor 725*c* and a stator 725*b* prevents the ultrasonic motor 725 from rotating (which is referred to as a manual focusing operation).

Two focus keys 728, being positioned in an opposed relationship, are attached to the rotation transmission ring 720. The focus key 728 is coupled with a cutout portion 715*b* provided at a front end of the cam ring 715. Accordingly, if the rotation transmission ring 720 rotates around the optical axis when an auto-focusing operation or a manual focusing operation is performed, the rotational force thereof is transmitted to the cam ring 715 via the focus key 728. When the cam ring 715 rotates around the optical axis, the cam roller 717*b* moves the rear group lens barrel 716 forward and rearward along the cam groove 715*a* of the cam ring 715 in a state where the rotation of the rear group lens barrel 716 is regulated by the cam roller 717*a* and the rectilinear guide groove 713*a*. Thus, the focus lens 702 is driven and a focusing operation is performed.

The optical device according to the present invention is not limited to the above-mentioned interchangeable lens barrel applicable to a single lens reflex camera and can be configured as a compact camera, an electronic still camera, a camera-equipped portable information terminal, or any other type of optical device that includes an ultrasonic motor serving as the above-mentioned driving unit.

<Vibrating Apparatus and Dust Removing Apparatus>

A vibrating apparatus that is configured to convey and remove particles, powder, and droplet can be widely used in electronic devices.

Hereinafter, a dust removing apparatus using the piezoelectric element according to the present invention, which is an example of the vibrating apparatus according to the present invention, is described in detail below.

The dust removing apparatus according to the present invention is characterized by a vibrating body that includes the piezoelectric element or the multilayered piezoelectric element disposed on a vibration plate.

Figure 9A:
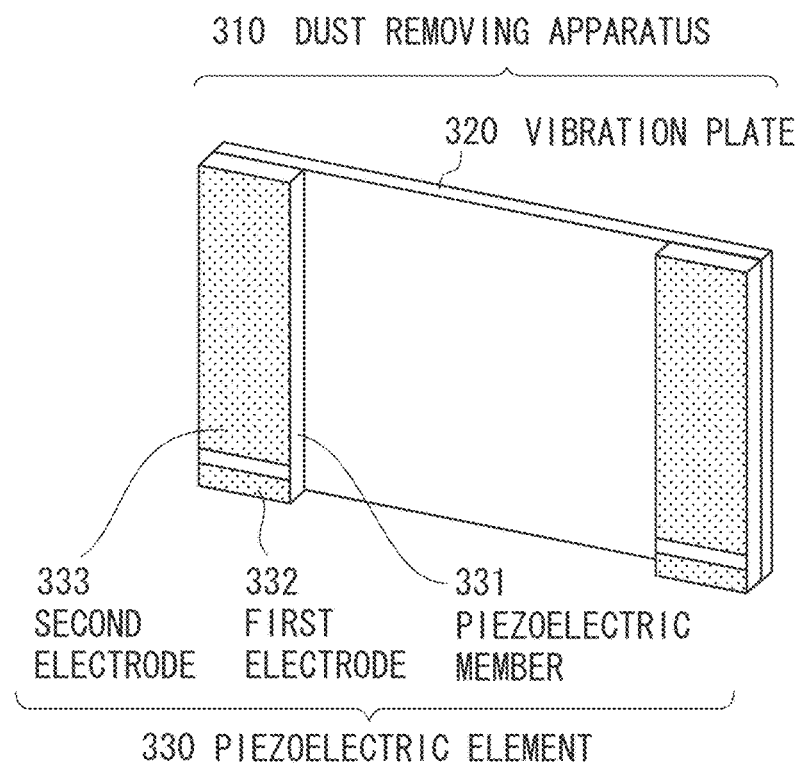
FIGS. 9A and 9B schematically illustrate a dust removing apparatus, as an example of a vibrating apparatus according to an embodiment of the present invention.
Figure 9B:
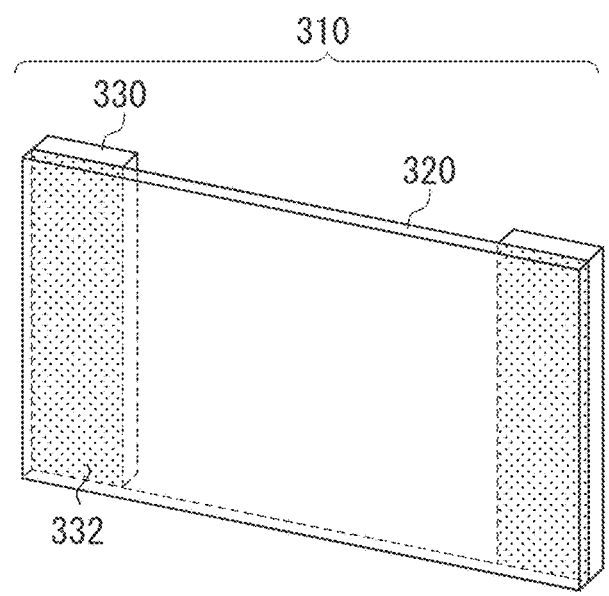

FIGS. 9A and 9B schematically illustrate a dust removing apparatus 310 according to an embodiment of the present invention. The dust removing apparatus 310 includes a pair of planar piezoelectric elements 330 and a vibration plate 320. Each piezoelectric element 330 can be configured as the multilayered piezoelectric element according to the present invention. The material of the vibration plate 320 is not required to have a specific quality. However, a light transmissive material or a light reflective material is usable for the vibration plate 320 when the dust removing apparatus 310 is used in an optical device.

Figures 10A, 10B, 10C:
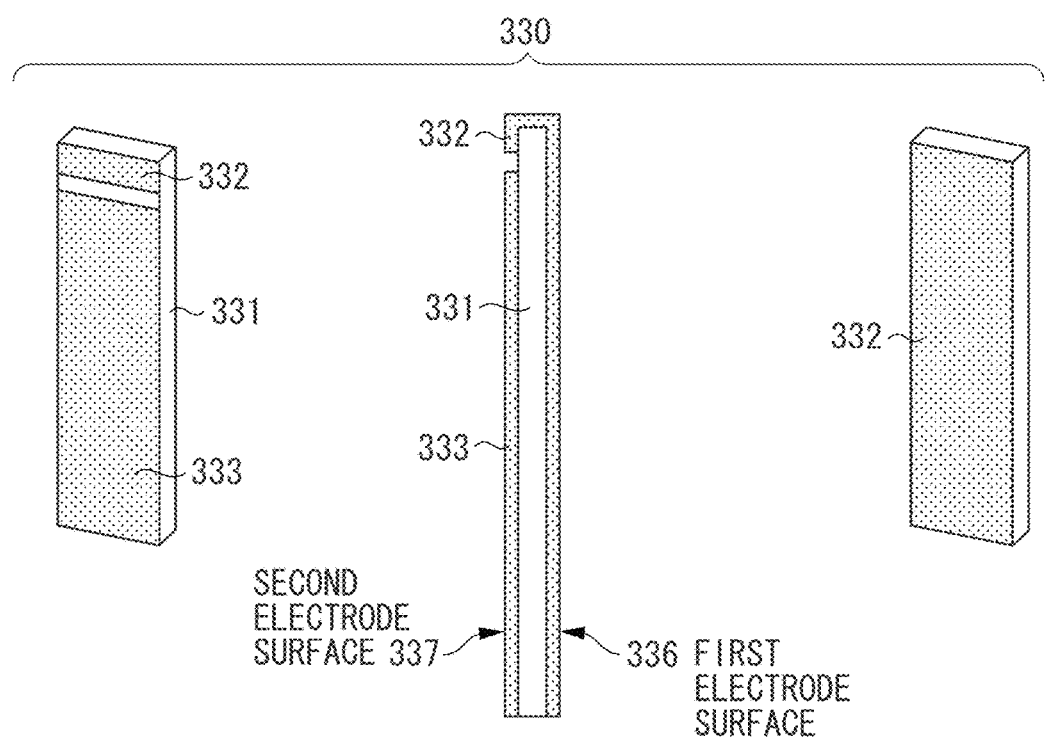
FIGS. 10A, 10B, and 10C schematically illustrate a configuration of a piezoelectric element that can be incorporated in the dust removing apparatus according to an embodiment of the present invention.

FIGS. 10A, 10B, and 10C schematically illustrate a configuration of the piezoelectric element 330 illustrated in FIGS. 9A and 9B. FIGS. 10A and 10C illustrate front and back surfaces of the piezoelectric element 330. FIG. 10B illustrates a side surface of the piezoelectric element 330. Each piezoelectric element 330 includes a piezoelectric member 331, a first electrode 332, and a second electrode 333, as illustrated in FIG. 9A. The first electrode 332 and the second electrode 333, being in an opposed relationship, are disposed on a plate surface of the piezoelectric member 331. As described with reference to FIGS. 9A and 9B, each piezoelectric element 330 can be configured as the multilayered piezoelectric element according to the present invention. In this case, it is feasible to give a driving waveform different in phase for each piezoelectric material layer when the piezoelectric member 331 is configured to have a structure including piezoelectric material layers and internal electrodes that are alternately disposed and when the internal electrodes are alternately connected to the first electrode 332 or the second electrode 333. In FIG. 10C, the surface on which the first electrode 332 is provided and is positioned on the front side of the piezoelectric element 330 is referred to as a first electrode surface 336. In FIG. 10A, the surface on which the second electrode 333 is provided and is positioned on the front side of the piezoelectric element 330 is referred to as a second electrode surface 337.

The electrode surface according to the present invention is a surface of the piezoelectric element on which the electrode is provided. For example, the first electrode 332 can be configured to have a wraparound shape so that a part of the first electrode 332 is provided on the second electrode surface 337, as illustrated in FIG. 10B.

A plate surface of the vibration plate 320 is fixed to the first electrode surface 336 of the piezoelectric element 330, as illustrated in FIGS. 9A and 9B. When the piezoelectric element 330 is driven, a stress generating between the piezoelectric element 330 and the vibration plate 320 induces an out-of-plane vibration of the vibration plate 320. The dust removing apparatus 310 according to the present invention is an apparatus that can remove foreign substances, such as dust particles adhering to the surface of the vibration plate 320, by using the out-of-plane vibration of the vibration plate 320. The out-of-plane vibration is an elastic vibration that causes a displacement of the vibration plate in the optical axis direction (i.e., the thickness direction of the vibration plate).

FIGS. 11A and 11B are schematic diagrams illustrating a principle of vibrations occurring in the dust removing apparatus 310 according to the present invention. FIG. 11A illustrates an out-of-plane vibration of the vibration plate 320 generated when alternating voltages having the same phase are applied to the pair of right and left piezoelectric elements 330. The polarization direction of a piezoelectric material that constitutes each of the right and left piezoelectric elements 330 is identical to the thickness direction of the piezoelectric element 330. The dust removing apparatus 310 is driving in a seventh vibration mode. FIG. 11B illustrates an out-of-plane vibration of the vibration plate 320 generated when alternating voltages having mutually opposite phases (180° different) are applied to the pair of right and left piezoelectric elements 330. In this case, the dust removing apparatus 310 is driving in a sixth vibration mode. The dust removing apparatus 310 according to the present invention can effectively remove dust particles adhering to the surface of the vibration plate by selectively operating in at least two vibration modes.

<Imaging Apparatus>

Figure 12:
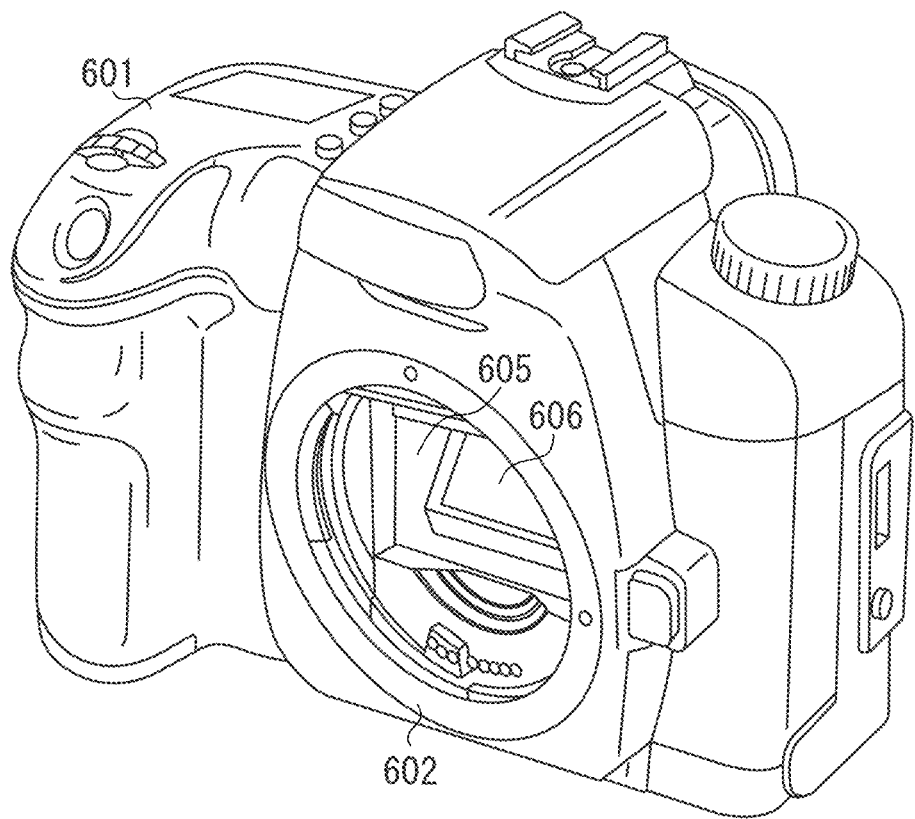
FIG. 12 schematically illustrates an imaging apparatus according to an embodiment of the present invention.
Figure 13:
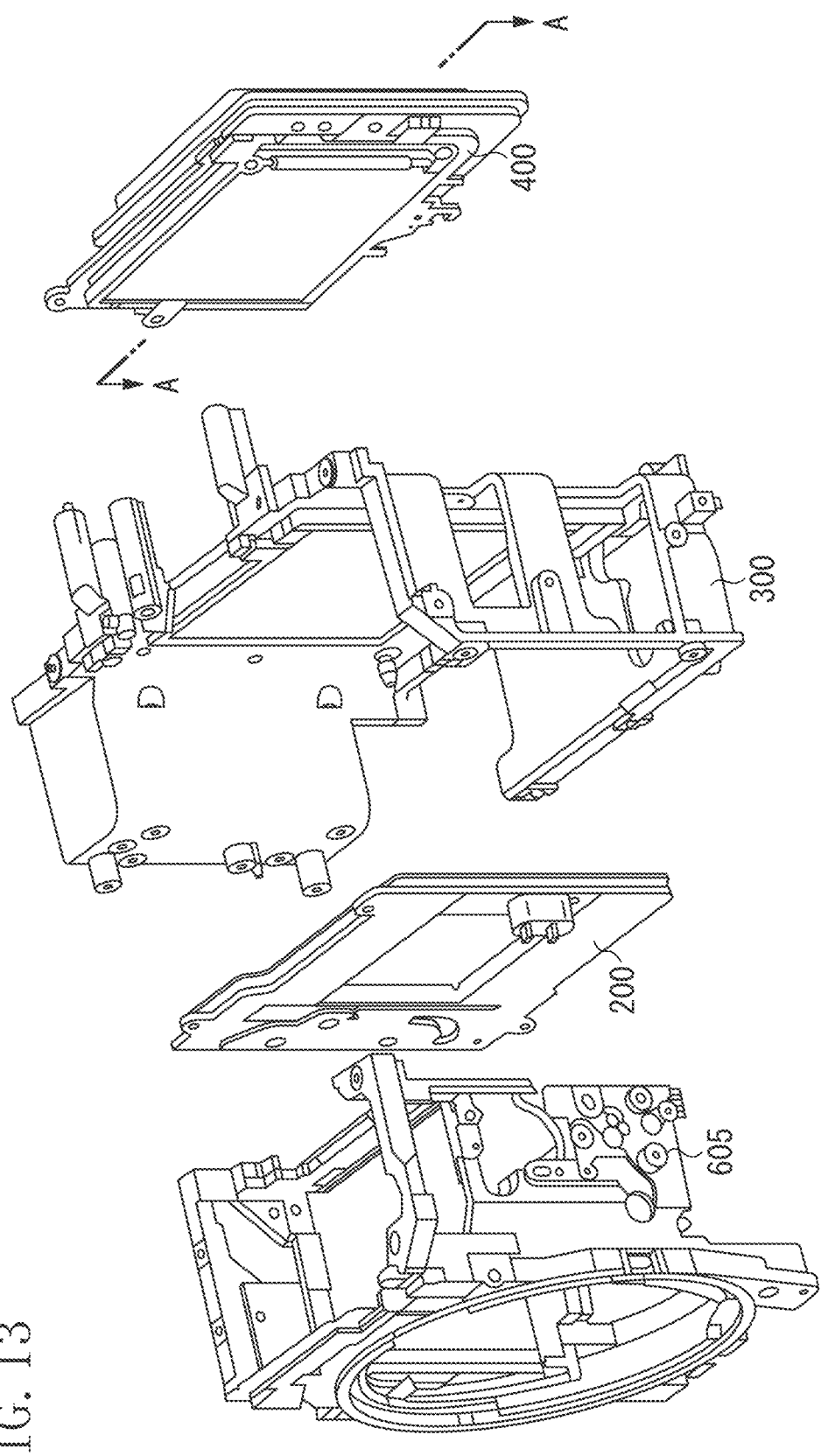
FIG. 13 schematically illustrates the imaging apparatus according to an embodiment of the present invention.

Next, an imaging apparatus according to the present invention is described in detail below. The imaging apparatus according to the present invention includes the above-mentioned dust removing apparatus and an image sensor unit, and is characterized in that the vibration plate of the dust removing apparatus is provided on a light-receiving surface of the image sensor unit. FIGS. 12 and 13 illustrate a digital single lens reflex camera, which is an example of the imaging apparatus according to an embodiment of the present invention.

FIG. 12 is a perspective view illustrating the front side of a camera body 601, which can be seen from the imaging target side in a state where an imaging lens unit is removed. FIG. 13 is an exploded perspective view illustrating a schematic configuration of the camera interior, in which the dust removing apparatus according to the present invention and a peripheral structure of the imaging unit 400 are described in detail.

After having passed through the imaging lens unit, an imaging luminous flux can be guided into a mirror box 605 provided in the camera body 601. A main mirror (e.g., a quick return mirror) 606 is disposed in the mirror box 605. The main mirror 606 can be held at an inclined angle (e.g., 45°) relative to an imaging optical axis to guide the imaging luminous flux toward a penta-Dach mirror (not illustrated) or can be held at a retreat position to guide the imaging luminous flux toward an image sensor (not illustrated).

The mirror box 605 and a shutter unit 200 are sequentially disposed on an imaging target side of a main body chassis 300 (i.e., a framework of the camera body). Further, the imaging unit 400 is disposed on a photographer side of the main body chassis 300. The imaging unit 400 is adjusted and placed in such a way that an imaging surface of the image sensor is spaced a predetermined distance from and positioned in parallel with a locating plane of a mount 602 to which the imaging lens unit is attached.

The imaging apparatus according to the present invention is not limited to the above-mentioned digital single lens reflex camera and can be configured as a mirrorless digital single-lens reflex camera that does not include the mirror box 605 or any other imaging lens unit interchangeable camera. Further, the imaging apparatus according to the present invention can be configured as an imaging lens unit interchangeable video camera or another imaging apparatus, such as a copy machine, a facsimile machine, or a scanner. The imaging apparatus according to the present invention can be applied to any other electrical and electronic device that requires removal of dust particles adhering to a surface of an optical component.

<Electronic Device>

Next, an electronic device according to the present invention is described in detail below. The electronic device according to the present invention is characterized by a piezoelectric acoustic device that includes the piezoelectric element or the multilayered piezoelectric element. The piezoelectric acoustic device is, for example, a speaker, a buzzer, a microphone, a surface acoustic wave (SAW) element.

Figure 14:
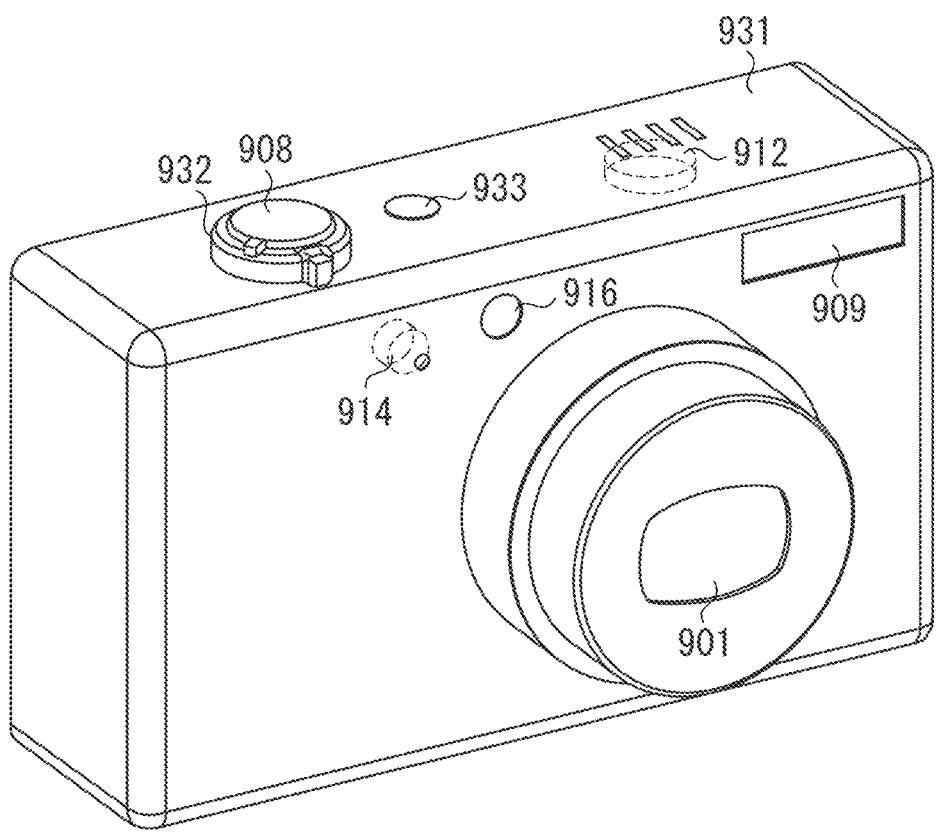
FIG. 14 schematically illustrates an electronic device according to an embodiment of the present invention.

FIG. 14 is an overall perspective view illustrating a main body 931 of a digital camera, which is seen from the front side thereof, as an example of the electronic device according to an embodiment of the present invention. An optical apparatus 901, a microphone 914, a flash lighting unit 909, and an auxiliary light unit 916 are disposed on a front surface of the main body 931. The microphone 914 is mostly incorporated in the main body 931. Therefore, the microphone 914 is indicated by a dotted line. To pick up ambient sounds, the front part of the microphone 914 is configured to have a through-hole shape.

A power button 933, a speaker 912, a zoom lever 932, and release button 908 operable to perform an in-focus operation are disposed on an upper surface of the main body 931. The speaker 912 is incorporated in the main body 931 and therefore indicated by a dotted line. An aperture is provided on the front side of the speaker 912 to output sounds.

The piezoelectric acoustic device according to the present invention can be provided in at least one of the microphone 914, the speaker 912, and a surface acoustic wave element.

The electronic device according to the present invention is not limited to the above-mentioned digital camera. For example, the electronic device according to the present invention can be configured as a sound reproduction device, a voice recording device, a mobile phone, an information terminal, or any other electronic device that incorporates a piezoelectric acoustic device.

As mentioned above, the piezoelectric element and the multilayered piezoelectric element according to the present invention can be preferably incorporated in a liquid discharge head, a liquid discharge apparatus, an ultrasonic motor, an optical device, a vibrating apparatus, a dust removing apparatus, an imaging apparatus, and an electronic device. Using the piezoelectric element and the multilayered piezoelectric element according to the present invention enables the provision of a liquid discharge head that is comparable to or superior to a referential liquid discharge head using a lead-containing piezoelectric element in nozzle density and discharge speed.

Using the liquid discharge head according to the present invention enables the provision of a liquid discharge apparatus that is comparable to or superior to a referential liquid discharge apparatus using a lead-containing piezoelectric element in discharge speed and discharge accuracy.

Using the piezoelectric element and the multilayered piezoelectric element according to the present invention enables the provision of an ultrasonic motor that is comparable to or superior to a referential ultrasonic motor using a lead-containing piezoelectric element in driving force and durability.

Using the ultrasonic motor according to the present invention enables the provision of an optical device that is comparable to or superior to a referential optical device using a lead-containing piezoelectric element in durability and operation accuracy.

Using the piezoelectric element and the multilayered piezoelectric element according to the present invention enables the provision of a vibrating apparatus that is comparable to or superior to a referential vibrating apparatus using a lead-containing piezoelectric element in vibration ability and durability.

Using the vibrating apparatus according to the present invention enables the provision of a dust removing apparatus that is comparable to or superior to a referential dust removing apparatus that uses a lead-containing piezoelectric element in dust removing efficiency and durability.

Using the dust removing apparatus according to the present invention enables the provision of an imaging apparatus that is comparable to or superior to a referential imaging apparatus using a lead-containing piezoelectric element in dust removing function.

Using the piezoelectric acoustic device including the piezoelectric element or the multilayered piezoelectric element according to the present invention enables the provision of an electronic device that is comparable to or superior to a referential electronic device using a lead-containing piezoelectric element in sound generation.

The piezoelectric material according to the present invention can be incorporated in an ultrasonic oscillator, a piezoelectric actuator, a piezoelectric sensor, and a ferroelectric memory in addition to the above-mentioned devices (e.g., the liquid discharge head and the motor).

Hereinafter, the present invention is described with reference to various examples. However, the present invention is not limited to the following description of the examples.

The following is a description of actually fabricated examples of the piezoelectric ceramics according to the present invention.

Examples 1 to 46 and 70 and Comparative Examples 1 to 17

The raw material powder used to fabricate the piezoelectric ceramics has an average grain diameter of 100 nm and includes, as main components, barium titanate ($BaTiO_3$, Ba/Ti=0.9985), calcium titanate ($CaTiO_3$, Ca/Ti=0.9978), calcium zirconate ($CaZrO_3$, Ca/Zr=0.999), and calcium stannate ($CaSnO_3$, Ca/Sn=1.0137). Further, the raw material powder includes barium oxalate to adjust the value "a" indicating the ratio of the total mole number of Ba and Ca to the total mole number of Ti, Zr, and Sn. The weighing of the raw material powders of the above-mentioned main components has been performed for each test piece in such a way as to attain the ratio illustrated in a table 1 when on a metal basis. The weighing of tetramanganese trioxide, lithium carbonate, and bismuth oxide has been performed for each test piece in such a manner that the contents of Mn (i.e., the first subcomponent), Li (i.e., the second subcomponent), and Bi (the third subcomponent), on a metal basis, attain the ratio illustrated in the table 1 when the main component metal oxide is 100 parts by weight. The above-mentioned weighed powder has been mixed in a ball mill, by dry mixing, for 24 hours. To granulate the obtained mixed powder, a spray-dryer has been used to cause a PVA binder, which is 3 parts by weight of the mixed powder, to adhere to a surface of the mixed powder. The test pieces of the examples 31 to 34 and the example 70 have been mixed with magnesium oxide so that the Mg weight on a metal basis becomes 0.0049, 0.0099, 0.0499, 0.0999 and 0.4999 parts by weight, respectively.

Next, a disk-shaped compact has been fabricated by using a press forming machine that applies a compacting pressure of 200 MPa to a mold filled with the above-mentioned granulated powder. It is useful to further press the fabricated compact, for example, by using a cold isostatic pressing machine.

Then, the above-mentioned compact has been placed in the electric furnace and held at the maximum temperature in a range of 1320 to 1380° C. for five hours. The compact has been sintered in the atmosphere for 24 hours. Through the above-mentioned processes, a ceramics made of the piezoelectric material according to the present invention has been obtained.

Then, crystal grains that constitute the obtained ceramics have been evaluated with respect to average equivalent circle diameter and relative density. As a result of the evaluation, it has been confirmed that the average equivalent circle diameter is in a range from 10 to 50 μm and the relative density of each test piece (except for the comparative example 7) is equal to or greater than 95%. The polarizing microscope has been mainly used to observe the crystal grains. Further, the scanning electron microscope (SEM) has been used to specify the grain diameter when the crystal grain is small. An observation result has been used to calculate the average equivalent circle diameter. Further, the relative density has been evaluated by using a lattice constant obtained by the X-ray diffraction, a theoretical density calculated based on the weighed composition, and an actual density measured according to the Archimedes method.

The test pieces of the examples 16 and 17 have been evaluated with respect to valence of Mn. The temperature dependency in the magnetic susceptibility has been measured by the SQUID in a range from 2 to 60K. It has been confirmed that the average valence of Mn obtained based on the temperature dependency in the magnetic susceptibility is +3.8 and 3.9 in the examples 16 and 17, respectively. Further, it has been confirmed that the average valence of Mn is less than +4.0 in other examples.

The tendency that the valence of Mn decreases with increasing molar ratio of Bi to Mn has been confirmed. Further, it has been confirmed in the comparative example 17 (i.e., the test piece not containing Bi) that the magnetic susceptibility of Mn is +4.0, when evaluated according to the similar method. More specifically, because the piezoelectric material according to the present invention includes Bi (i.e., the third subcomponent) in such a way as to reduce the valence of Mn (i.e., the first subcomponent), the ability of the piezoelectric material serving as the acceptor of Mn can be promoted. As a result, the mechanical quality factor of the piezoelectric material according to the present invention becomes higher.

Next, the obtained ceramics has been polished to have a thickness of 0.5 mm and the crystal structure has been analyzed based on X-ray diffraction. As a result, only the peak corresponding to the perovskite structure has been observed in all test pieces except for the comparative example 1.

Next, the composition of the obtained ceramics has been evaluated based on ICP emission spectrophotometric analysis. It has been confirmed in all piezoelectric materials that the composition after sintering coincides with the composition after weighing with respect to Ba, Ca, Ti, Zr, Sn, Mn, Li and Bi. Further, in the examples 1 to 30 and 35 to 46 and the comparative examples 1 to 12 and 15 to 17, it has been confirmed that the content of Mg is 0.0001 parts by weight when the metal oxide expressed using the chemical formula $(Ba_{1-x}Ca_x)_a(Ti_{1-y-z}Zr_ySn_z)O_3$ is 100 parts by weight. On the other hand, in the examples 31 to 34, it has been confirmed that the content of Mg is 0.0050, 0.0100, 0.0500, and 0.1000 parts by weight, respectively. In the example 70, it has been confirmed that the content of Mg is 0.5000 parts by weight.

Then, gold electrodes each having a thickness of 400 nm have been formed on the front and back surfaces of the disk-shaped ceramics according to a DC sputtering method. In addition, a titanium film having a thickness of 30 nm has been formed to provide an adhesion layer between each electrode and the ceramics. Then, the electrode equipped ceramics has been cut into a strip-form piezoelectric element having a size of 10 mm×2.5 mm×0.5 mm. The fabricated piezoelectric element has been placed on a hot plate whose surface temperature increases from 60° C. to 100° C. The piezoelectric element placed on the hot plate has been subjected to polarization processing under an application of an electric field of 1 kV/mm for 30 minutes.

As static characteristics of a piezoelectric element that includes a piezoelectric material according to the present invention or a piezoelectric material according to a comparative example, the piezoelectric constant $d_{31}$ and the mechanical quality factor Qm of the piezoelectric element subjected to the polarization processing have been evaluated according to the resonant-antiresonant method. In calculating $T_{ot}$, $T_{to}$, and $T_C$, an impedance analyzer (e.g., 4194A manufactured by Agilent Techonologies Inc.) has been used to measure the electrostatic capacitance while changing the temperature of respective test pieces. Simultaneously, the impedance analyzer has been used to measure the temperature dependency in the dielectric tangent. The test piece has been cooled until the temperature deceases to −100° C. from the room temperature and then heated until the temperature reaches 150° C. The phase transition temperature $T_{to}$ represents the temperature at which the crystal system changes from tetragonal to orthorhombic. The phase transition temperature $T_{to}$ has been defined as the temperature at which a derivative, which is obtainable by differentiating a dielectric constant measured in the cooling process of the test piece by the test piece temperature, can be maximized. $T_{ot}$ represents the temperature at which the crystal system changes from orthorhombic to tetragonal and has been defined as the temperature at which a derivative, which is obtainable by differentiating the dielectric constant measured in the heating process of the test piece by the test piece temperature, can be maximized. The Curie temperature $T_C$ represents the temperature at which the dielectric constant can be maximized around the phase transition temperature of the ferroelectric phase (tetragonal phase) and the paraelectric phase (cubic phase). The Curie temperature $T_C$ has been defined as the temperature at which the dielectric constant value measured in the heating process of the test piece becomes a maximal value.

TABLE 1

| | Main Component | | | | | | First Subcomponent Mn | Second Subcomponent Li | Third Subcomponent Bi | Sintering |
| --- | --- | --- | --- | --- | --- | --- | --- | --- | --- | --- |
| | Ba 1 − x | Ca x | Ti 1 − y − z | Zr y | Sn z | a | Parts By Weight | Parts By Weight | Parts By Weight | Temperature (° C.) |
| Comparative Example 1 | 0.680 | 0.320 | 0.915 | 0.085 | 0.000 | 0.9990 | 0.240 | 0.0053 | 0.170 | 1360 |
| Example 1 | 0.700 | 0.300 | 0.915 | 0.085 | 0.000 | 0.9994 | 0.120 | 0.0053 | 0.170 | 1360 |
| Example 2 | 0.700 | 0.300 | 0.915 | 0.085 | 0.000 | 0.9994 | 0.240 | 0.0053 | 0.170 | 1360 |
| Example 3 | 0.700 | 0.300 | 0.918 | 0.082 | 0.000 | 0.9994 | 0.240 | 0.0053 | 0.170 | 1360 |
| Example 4 | 0.700 | 0.300 | 0.924 | 0.076 | 0.000 | 0.9994 | 0.240 | 0.0053 | 0.170 | 1360 |
| Example 5 | 0.700 | 0.300 | 0.925 | 0.075 | 0.000 | 0.9994 | 0.240 | 0.0053 | 0.170 | 1360 |
| Example 6 | 0.720 | 0.280 | 0.925 | 0.075 | 0.000 | 0.9994 | 0.240 | 0.0053 | 0.170 | 1360 |
| Example 7 | 0.740 | 0.260 | 0.923 | 0.077 | 0.000 | 0.9994 | 0.240 | 0.0053 | 0.170 | 1360 |
| Example 8 | 0.740 | 0.260 | 0.918 | 0.082 | 0.000 | 0.9994 | 0.240 | 0.0053 | 0.170 | 1360 |
| Example 9 | 0.740 | 0.260 | 0.924 | 0.076 | 0.000 | 0.9994 | 0.240 | 0.0053 | 0.170 | 1360 |
| Example 10 | 0.780 | 0.220 | 0.918 | 0.082 | 0.000 | 0.9994 | 0.240 | 0.0053 | 0.170 | 1360 |
| Example 11 | 0.800 | 0.200 | 0.925 | 0.075 | 0.000 | 0.9994 | 0.240 | 0.0053 | 0.170 | 1360 |
| Example 12 | 0.813 | 0.187 | 0.923 | 0.077 | 0.000 | 0.9994 | 0.240 | 0.0053 | 0.170 | 1360 |
| Example 13 | 0.813 | 0.187 | 0.901 | 0.079 | 0.020 | 0.9994 | 0.240 | 0.0053 | 0.170 | 1360 |
| Comparative Example 2 | 0.830 | 0.170 | 0.915 | 0.085 | 0.000 | 1.0031 | 0.180 | 0.0013 | 0.025 | 1340 |
| Example 14 | 0.830 | 0.170 | 0.915 | 0.075 | 0.010 | 0.9971 | 0.180 | 0.0053 | 0.170 | 1340 |
| Example 15 | 0.830 | 0.170 | 0.905 | 0.075 | 0.020 | 0.9971 | 0.180 | 0.0048 | 0.170 | 1340 |
| Example 16 | 0.830 | 0.170 | 0.915 | 0.085 | 0.000 | 0.9971 | 0.180 | 0.0026 | 0.170 | 1340 |
| Comparative Example 3 | 0.830 | 0.170 | 0.925 | 0.075 | 0.000 | 1.0031 | 0.360 | 0.0013 | 0.025 | 1340 |
| Example 17 | 0.830 | 0.170 | 0.925 | 0.075 | 0.000 | 1.0042 | 0.360 | 0.0053 | 0.170 | 1340 |
| Comparative Example 4 | 0.840 | 0.160 | 0.915 | 0.085 | 0.000 | 1.0031 | 0.180 | 0.0013 | 0.025 | 1340 |
| Example 18 | 0.840 | 0.160 | 0.915 | 0.075 | 0.010 | 0.9971 | 0.180 | 0.0046 | 0.170 | 1340 |
| Example 19 | 0.840 | 0.160 | 0.915 | 0.085 | 0.000 | 0.9971 | 0.180 | 0.0046 | 0.170 | 1340 |
| Comparative Example 5 | 0.840 | 0.160 | 0.922 | 0.078 | 0.000 | 1.0100 | 0.360 | 0.0013 | 0.025 | 1340 |
| Example 20 | 0.840 | 0.160 | 0.922 | 0.078 | 0.000 | 1.0042 | 0.360 | 0.0046 | 0.170 | 1340 |

TABLE 1-continued

|  | Main Component | | | | | | First Subcomponent Mn Parts By Weight | Second Subcomponent Li Parts By Weight | Third Subcomponent Bi Parts By Weight | Sintering Temperature (° C.) |
| --- | --- | --- | --- | --- | --- | --- | --- | --- | --- | --- |
|  | Ba 1 − x | Ca x | Ti 1 − y − z | Zr y | Sn z | a |  |  |  |  |
| Example 21 | 0.845 | 0.155 | 0.922 | 0.078 | 0.000 | 0.9994 | 0.240 | 0.0046 | 0.170 | 1340 |
| Example 22 | 0.860 | 0.140 | 0.922 | 0.078 | 0.000 | 0.9955 | 0.160 | 0.0050 | 0.181 | 1320 |
| Comparative Example 6 | 0.870 | 0.130 | 0.925 | 0.075 | 0.000 | 1.0055 | 0.240 | 0.0013 | 0.025 | 1320 |
| Comparative Example 7 | 0.870 | 0.130 | 0.925 | 0.075 | 0.000 | 1.0210 | 0.240 | 0.0039 | 0.170 | 1320 |
| Comparative Example 8 | 0.870 | 0.130 | 0.925 | 0.075 | 0.000 | 0.9850 | 0.240 | 0.0039 | 0.170 | 1320 |
| Example 23 | 0.870 | 0.130 | 0.925 | 0.075 | 0.000 | 0.9994 | 0.240 | 0.0049 | 0.170 | 1350 |
| Comparative Example 9 | 0.880 | 0.120 | 0.920 | 0.080 | 0.000 | 1.0055 | 0.240 | 0.0013 | 0.025 | 1320 |
| Example 24 | 0.880 | 0.120 | 0.920 | 0.080 | 0.000 | 0.9994 | 0.240 | 0.0050 | 0.170 | 1320 |
| Example 25 | 0.880 | 0.120 | 0.920 | 0.080 | 0.000 | 0.9994 | 0.240 | 0.0083 | 0.340 | 1320 |
| Comparative Example 10 | 0.890 | 0.110 | 0.925 | 0.075 | 0.000 | 1.0055 | 0.240 | 0.0013 | 0.025 | 1320 |
| Example 26 | 0.890 | 0.110 | 0.925 | 0.075 | 0.000 | 0.9994 | 0.240 | 0.0039 | 0.170 | 1350 |
| Example 27 | 0.890 | 0.110 | 0.925 | 0.075 | 0.000 | 0.9994 | 0.240 | 0.0043 | 0.170 | 1320 |
| Example 28 | 0.890 | 0.110 | 0.925 | 0.075 | 0.000 | 0.9994 | 0.240 | 0.0098 | 0.340 | 1320 |
| Example 29 | 0.890 | 0.110 | 0.925 | 0.075 | 0.000 | 0.9969 | 0.240 | 0.0058 | 0.510 | 1320 |
| Comparative Example 12 | 0.915 | 0.085 | 0.925 | 0.075 | 0.000 | 0.9998 | 0.240 | 0.0050 | 0.170 | 1320 |
| Example 30 | 0.890 | 0.110 | 0.925 | 0.075 | 0.000 | 0.9994 | 0.040 | 0.0120 | 0.850 | 1320 |
| Example 31 | 0.860 | 0.140 | 0.925 | 0.075 | 0.000 | 1.0004 | 0.160 | 0.0026 | 0.094 | 1340 |
| Example 32 | 0.860 | 0.140 | 0.925 | 0.075 | 0.000 | 1.0004 | 0.160 | 0.0024 | 0.094 | 1340 |
| Example 33 | 0.860 | 0.140 | 0.925 | 0.075 | 0.000 | 1.0004 | 0.160 | 0.0028 | 0.094 | 1340 |
| Example 34 | 0.860 | 0.140 | 0.925 | 0.075 | 0.000 | 1.0004 | 0.160 | 0.0023 | 0.094 | 1340 |
| Example 70 | 0.860 | 0.140 | 0.925 | 0.075 | 0.000 | 1.0004 | 0.160 | 0.0026 | 0.094 | 1340 |
| Example 35 | 0.860 | 0.140 | 0.925 | 0.075 | 0.000 | 1.0004 | 0.160 | 0.0026 | 0.094 | 1340 |
| Example 36 | 0.860 | 0.140 | 0.925 | 0.075 | 0.000 | 1.0004 | 0.160 | 0.0048 | 0.189 | 1340 |
| Example 37 | 0.860 | 0.140 | 0.925 | 0.075 | 0.000 | 1.0004 | 0.160 | 0.0080 | 0.239 | 1340 |
| Example 38 | 0.860 | 0.140 | 0.925 | 0.075 | 0.000 | 1.0004 | 0.160 | 0.0063 | 0.189 | 1320 |
| Example 39 | 0.860 | 0.140 | 0.925 | 0.075 | 0.000 | 1.0004 | 0.160 | 0.0026 | 0.189 | 1340 |
| Example 40 | 0.860 | 0.140 | 0.925 | 0.075 | 0.000 | 1.0004 | 0.160 | 0.0098 | 0.189 | 1380 |
| Example 41 | 0.860 | 0.140 | 0.915 | 0.085 | 0.000 | 1.0004 | 0.160 | 0.0130 | 0.539 | 1380 |
| Example 42 | 0.860 | 0.140 | 0.920 | 0.080 | 0.000 | 1.0004 | 0.140 | 0.0046 | 0.189 | 1340 |
| Example 43 | 0.860 | 0.140 | 0.920 | 0.080 | 0.000 | 1.0004 | 0.140 | 0.0074 | 0.289 | 1340 |
| Example 44 | 0.860 | 0.140 | 0.920 | 0.080 | 0.000 | 1.0004 | 0.140 | 0.0100 | 0.339 | 1340 |
| Example 45 | 0.830 | 0.170 | 0.925 | 0.075 | 0.000 | 0.9998 | 0.140 | 0.0046 | 0.189 | 1380 |
| Example 46 | 0.830 | 0.170 | 0.915 | 0.085 | 0.000 | 1.0010 | 0.120 | 0.0049 | 0.189 | 1300 |
| Comparative Example 14 | 0.830 | 0.170 | 0.905 | 0.095 | 0.000 | 1.0010 | 0.120 | 0.0048 | 0.189 | 1300 |
| Comparative Example 15 | 0.830 | 0.170 | 0.888 | 0.082 | 0.030 | 1.0010 | 0.120 | 0.0064 | 0.189 | 1300 |
| Comparative Example 16 | 1.000 | 0.000 | 1.000 | 0.000 | 0.000 | 1.0000 | 0.023 | 0.0048 | 0.188 | 1320 |
| Comparative Example 17 | 1.000 | 0.000 | 1.000 | 0.000 | 0.000 | 1.0000 | 0.023 | 0.0000 | 0.000 | 1320 |

Table 2 summarizes properties of the test pieces according to the examples and the comparative examples in the table 1 with respect to piezoelectric constant $d_{31}$, mechanical quality factor, dielectric tangent, $T_c$, $T_{to}$, and $T_{ot}$ at the room temperature.

TABLE 2

|  | Piezoelectric Constant d31(pm/V) | Mechanical Quality Factor (—) | Dielectric Tangent (—) | Tc(° C.) | Tto(° C.) | Tot(° C.) |
| --- | --- | --- | --- | --- | --- | --- |
| Comparative Example 1 | 63 | 540 | 0.004 | 102 | −37 | −30 |
| Example 1 | 112 | 810 | 0.003 | 102 | −45 | −37 |
| Example 2 | 103 | 870 | 0.001 | 102 | −33 | −26 |
| Example 3 | 102 | 880 | 0.002 | 103 | −37 | −32 |
| Example 4 | 100 | 890 | 0.005 | 106 | −44 | −39 |
| Example 5 | 99 | 890 | 0.006 | 106 | −45 | −39 |
| Example 6 | 97 | 910 | 0.002 | 106 | −37 | −28 |
| Example 7 | 96 | 910 | 0.003 | 105 | −35 | −29 |
| Example 8 | 101 | 920 | 0.005 | 103 | −29 | −23 |
| Example 9 | 95 | 920 | 0.002 | 106 | −36 | −30 |
| Example 10 | 109 | 870 | 0.001 | 103 | −21 | −19 |
| Example 11 | 106 | 870 | 0.003 | 106 | −25 | −20 |
| Example 12 | 112 | 860 | 0.002 | 105 | −23 | −19 |
| Example 13 | 114 | 840 | 0.005 | 104 | −22 | −18 |
| Comparative Example 2 | 88 | 600 | 0.002 | 102 | −28 | −20 |
| Example 14 | 93 | 810 | 0.001 | 106 | −35 | −28 |
| Example 15 | 91 | 810 | 0.002 | 106 | −33 | −23 |
| Example 16 | 90 | 800 | 0.004 | 102 | −34 | −24 |
| Comparative Example 3 | 86 | 610 | 0.001 | 106 | −22 | −19 |

TABLE 2-continued

| | Piezoelectric Constant d31(pm/V) | Mechanical Quality Factor (—) | Dielectric Tangent (—) | Tc(° C.) | Tto(° C.) | Tot(° C.) |
|---|---|---|---|---|---|---|
| Example 17 | 93 | 990 | 0.002 | 106 | −21 | −18 |
| Comparative Example 4 | 87 | 680 | 0.005 | 102 | −26 | −20 |
| Example 18 | 97 | 830 | 0.006 | 106 | −24 | −18 |
| Example 19 | 106 | 830 | 0.001 | 102 | −23 | −19 |
| Comparative Example 5 | 88 | 620 | 0.003 | 105 | −26 | −21 |
| Example 20 | 94 | 1010 | 0.005 | 105 | −22 | −18 |
| Example 21 | 93 | 900 | 0.002 | 105 | −23 | −19 |
| Example 22 | 89 | 860 | 0.004 | 105 | −32 | −23 |
| Comparative Example 6 | 85 | 690 | 0.003 | 106 | −25 | −20 |
| Comparative Example 7 | 72 | 950 | 0.001 | 106 | −21 | −18 |
| Comparative Example 8 | 68 | 950 | 0.002 | 106 | −21 | −18 |
| Example 23 | 85 | 970 | 0.005 | 106 | −23 | −18 |
| Comparative Example 9 | 88 | 580 | 0.003 | 104 | −18 | −14 |
| Example 24 | 98 | 970 | 0.001 | 104 | −24 | −20 |
| Example 25 | 90 | 1130 | 0.002 | 104 | −28 | −22 |
| Comparative Example 10 | 87 | 640 | 0.001 | 106 | −16 | −10 |
| Example 26 | 96 | 990 | 0.005 | 106 | −27 | −21 |
| Example 27 | 96 | 990 | 0.003 | 106 | −27 | −21 |
| Example 28 | 90 | 1160 | 0.001 | 106 | −30 | −21 |
| Example 29 | 85 | 1200 | 0.002 | 106 | −33 | −23 |
| Comparative Example 12 | 84 | 1040 | 0.003 | 106 | −10 | 0 |
| Example 30 | 98 | 1240 | 0.004 | 106 | −37 | −30 |
| Example 31 | 97 | 870 | 0.003 | 106 | −30 | −22 |
| Example 32 | 98 | 860 | 0.001 | 106 | −31 | −23 |
| Example 33 | 99 | 870 | 0.002 | 106 | −30 | −24 |
| Example 34 | 100 | 840 | 0.005 | 106 | −32 | −26 |
| Example 70 | 89 | 740 | 0.003 | 106 | −29 | −23 |
| Example 35 | 97 | 850 | 0.001 | 106 | −29 | −22 |
| Example 36 | 96 | 870 | 0.002 | 106 | −32 | −24 |
| Example 37 | 95 | 920 | 0.001 | 106 | −34 | −28 |
| Example 38 | 94 | 870 | 0.002 | 106 | −32 | −24 |
| Example 39 | 93 | 850 | 0.002 | 102 | −33 | −25 |
| Example 40 | 96 | 840 | 0.006 | 106 | −33 | −25 |
| Example 41 | 90 | 1200 | 0.002 | 106 | −40 | −32 |
| Example 42 | 104 | 850 | 0.004 | 104 | −30 | −20 |
| Example 43 | 98 | 950 | 0.003 | 104 | −34 | −26 |
| Example 44 | 96 | 1000 | 0.005 | 104 | −36 | −28 |
| Example 45 | 92 | 1120 | 0.003 | 106 | −39 | −30 |
| Example 46 | 110 | 970 | 0.001 | 104 | −38 | −32 |
| Comparative Example 14 | 85 | 770 | 0.002 | 98 | −10 | −4 |
| Comparative Example 15 | 83 | 760 | 0.004 | 97 | −19 | −13 |
| Comparative Example 16 | 55 | 220 | 0.015 | 123 | −16 | 0 |
| Comparative Example 17 | 74 | 280 | 0.020 | 127 | −4 | 16 |

The test piece of the comparative example 1 has a larger Ca amount "x" value (i.e., 0.320). In the measurement of X-ray diffraction, a $CaTiO_3$ phase has been detected. It has been confirmed that the piezoelectric constant $d_{31}$ of the test piece is lower by 39 pm/V compared to the test piece of the example 3 that is identical to the comparative example 1 in the amounts of Ti, Zr, and Bi, although the Ca amount "x" is 0.300.

The test piece of the comparative example 12 has a smaller Ca amount "x" value (i.e., 0.085). Therefore, the test piece of the comparative example 12 has a higher $T_{to}$ value (i.e., −10° C.) and a higher $T_{ot}$ value (i.e., 0° C.)

The test piece of the comparative example 14 has a larger Zr amount "y" value (i.e., 0.095). Therefore, the $T_c$ value is lower (i.e., 98° C.), the $T_t$ value is higher (−10° C.), and the $T_{ot}$ value is higher (−4° C.). On the contrary, in the test piece of the example 46 (y=0.085) that is identical to the test piece of the comparative example 14 in the Ca amount, it has been confirmed that the $T_c$ value is 104° C., the $T_{to}$ value is −38° C., and the $T_{ot}$ value is −32° C.

The test piece of the comparative example 8 has a larger grain diameter (i.e., 80 μm) because the "a" value is small (i.e., 0.985).

The test piece of the example 14 contains Ti a part of which is replaced by Zr and Sn and has demonstrated a higher Qm value (by an amount of 210), a lower $T_{to}$ value (by an amount of 7° C.), and a lower $T_{ot}$ value (by an amount of 8° C.) compared to the comparative example 2 (y=0.075 and z=0.000) that is identical to the example 14 in the Ti amount.

The test piece of the comparative example 15 has a larger Sn amount "z" (i.e., 0.03) and has a lower $T_c$ value (i.e., 97° C.)

The test pieces of the examples 31 to 34 whose Mg amount is in a range of 0.005 to 0.1000 parts by weight have demonstrated higher mechanical quality factors (by an amount equal to or greater than 100) compared to the test piece of the example 70 whose Mg amount exceeds 0.1000 parts by weight.

Further, the test pieces of the comparative examples 16 and 17 have extremely lower mechanical quality factors lower than 300.

It has been confirmed that increasing the Bi amount slightly decreases the piezoelectric constant and greatly increases the mechanical quality factor as apparent from respective comparisons between the comparative example 2 and the example 16, between the comparative example 3 and the example 17, between the comparative example 4 and the example 19, between the comparative example 5 and the example 20, and between the comparative example 6 and the example 23.

The test piece of the example 38 has demonstrated that a mole number obtainable by dividing the Li content α (0.0063) by the Li atomic weight ML (6.94) is substantially identical to a mole number obtainable by dividing the Bi content β (0.189) by the Bi atomic weight MB (208.98). The Curie temperature of the example 38 is higher by an amount of 4° C. compared to the example 39 in which a mole number obtainable by dividing the Li content α (0.0026) by the Li atomic weight ML (6.94) is less than a half of the mole number obtainable by dividing the Bi content β (0.189) by the Bi atomic weight MB (208.98).

The test piece of the example 38 in which the mole number obtainable by dividing the Li content α (0.0063) by the Li atomic weight ML (6.94) is substantially identical to the mole number obtainable by dividing the Bi content β (0.189) by the Bi atomic weight MB (208.98) has demonstrated that the dielectric tangent at the room temperature is lower compared to the example 40 in which a mole number obtainable by dividing the Li content α (0.0098) by the Li atomic weight ML (6.94) is greater than a mole number obtainable by dividing the Bi content β (0.189) by the Bi atomic weight MB (208.98).

Further, it has been confirmed that increasing the Bi component lowers the $T_{to}$ and $T_{ot}$ values without lowering the $T_c$ value of the piezoelectric material as apparent from the phase transition temperatures in the comparative examples 6, 9, and 10 and the examples 23, 24, 25, 26, 28, and 29.

Next, to confirm the durability of the piezoelectric element, the test pieces of the examples and the comparative examples listed in the table 1 have been placed in a thermostat chamber and subjected to a temperature cycle test. The temperature cycle test includes 100 cycles repetitively performed, in each cycle of which the temperature changes in order of 25° C.→−20° C.→50° C.→25° C. The piezoelectric constant $d_{31}$ values have been compared before and after the cycle test. The test pieces of the examples 23, 24, 25, 26, 28, and 29, in which the phase transition temperature $T_{to}$ is −20 or lower, have demonstrated that a change rate in the piezoelectric constant $d_{31}$ is 5% or less. On the other hand, the test pieces of the comparative examples 9 and 10 whose phase transition temperature $T_{to}$ is higher than −20° C. have demonstrated that a reduction amount of the piezoelectric constant $d_{31}$ is greater than 5%. In the comparative example 6, the phase transition temperature $T_{to}$ of the test piece is equal to or less than −20° C. The change rate in the piezoelectric constant $d_{31}$ after the cycle test is equal to or less than 5%. However, the mechanical quality factor at the room temperature is lower (by an amount of 310) compared to the example 23.

Further, the test pieces of the examples, in which the phase transition temperature $T_{to}$ is −20 or lower, have demonstrated that a change rate in piezoelectric characteristics is 5% or less.

The test piece whose phase transition temperature $T_{to}$ is higher than −20° C. causes repetitive phase transitions between tetragonal and orthorhombic during the temperature cycle test. Causing repetitive phase transitions between crystal systems that are different in spontaneous polarization direction can promote depolarization. It is believed that the reduced amount of the piezoelectric constant $d_{31}$ is larger in the test piece whose phase transition temperature $T_{to}$ is higher than −20° C. More specifically, the piezoelectric ceramics can be evaluated as being dissatisfactory in element durability if the phase transition temperature $T_t$ is high than −20° C.

Examples 47 to 54 and Comparative Examples 18 to 22

The raw material powder used to fabricate the piezoelectric ceramics has an average grain diameter of 100 nm and includes barium titanate, calcium titanate, calcium zirconate, lithium carbonate, bismuth oxide, and tetramanganese trioxide, in addition to glass assistant containing Si and B (including $SiO_2$ by 30 to 50 wt. %, and $B_2O_3$ by 21.1 wt. %). The weighing of the above-mentioned raw material powder has been performed for each test piece in such a way as to realize the ratio indicated in table 3. Subsequently, a compact has been fabricated using a method similar to that used for the test pieces described in the table 1. The obtained compact has been held in an electric furnace held at 1200° C. for five hours and sintered in the atmosphere for 24 hours. Subsequently, each test piece has been subjected to working and evaluation similar to those applied to the test pieces described in the table 1.

TABLE 3

| | Main Component | | | | | | First Subcomponent Mn | Second Subcomponent Li | Third Subcomponent Bi | Fifth Subcomponent Glass Assistant | Sintering |
| | Ba 1 − x | Ca x | Ti 1 − y − z | Zr y | Sn z | a | Parts By Weight | Parts By Weight | Parts By Weight | Parts By Weight | Temperature (° C.) |
|---|---|---|---|---|---|---|---|---|---|---|---|
| Comparative Example 18 | 0.870 | 0.130 | 0.925 | 0.075 | 0 | 1.0079 | 0.300 | 0.0013 | 0.025 | 0.100 | 1200 |
| Example 47 | 0.870 | 0.130 | 0.925 | 0.075 | 0 | 1.0019 | 0.300 | 0.0020 | 0.084 | 0.100 | 1200 |
| Example 48 | 0.870 | 0.130 | 0.925 | 0.075 | 0 | 1.0019 | 0.300 | 0.0060 | 0.170 | 0.100 | 1200 |
| Comparative Example 19 | 0.870 | 0.130 | 0.925 | 0.075 | 0 | 0.9900 | 0.000 | 0.0048 | 0.170 | 0.100 | 1200 |
| Comparative Example 20 | 0.870 | 0.130 | 0.925 | 0.075 | 0 | 1.0060 | 0.400 | 0.0050 | 0.170 | 0.100 | 1200 |
| Example 49 | 0.870 | 0.130 | 0.925 | 0.075 | 0 | 1.0019 | 0.300 | 0.0080 | 0.250 | 0.100 | 1200 |
| Example 50 | 0.870 | 0.130 | 0.925 | 0.075 | 0 | 0.9968 | 0.300 | 0.0200 | 0.840 | 0.100 | 1200 |
| Comparative Example 21 | 0.870 | 0.130 | 0.925 | 0.075 | 0 | 0.9968 | 0.300 | 0.0280 | 1.690 | 0.100 | 1200 |
| Example 51 | 0.880 | 0.120 | 0.915 | 0.085 | 0 | 1.0019 | 0.300 | 0.0080 | 0.250 | 0.100 | 1200 |
| Example 52 | 0.890 | 0.110 | 0.925 | 0.075 | 0 | 1.0019 | 0.300 | 0.0079 | 0.250 | 0.100 | 1200 |
| Example 53 | 0.900 | 0.100 | 0.925 | 0.075 | 0 | 1.0019 | 0.300 | 0.0070 | 0.250 | 0.100 | 1200 |

TABLE 3-continued

| | Main Component | | | | | | First Subcomponent Mn | Second Subcomponent Li | Third Subcomponent Bi | Fifth Subcomponent Glass Assistant | Sintering |
|---|---|---|---|---|---|---|---|---|---|---|---|
| | Ba $1-x$ | Ca $x$ | Ti $1-y-z$ | Zr $y$ | Sn $z$ | a | Parts By Weight | Parts By Weight | Parts By Weight | Parts By Weight | Temperature (° C.) |
| Example 54 | 0.910 | 0.090 | 0.915 | 0.085 | 0 | 1.0019 | 0.300 | 0.0068 | 0.250 | 0.100 | 1200 |
| Comparative Example 22 | 0.910 | 0.090 | 0.915 | 0.085 | 0 | 1.0019 | 0.300 | 0.0480 | 0.250 | 0.100 | 1200 |

The following table 4 summarizes measurement results of the examples and the comparative examples described in table 3 at the room temperature with respect to electromechanical coupling factor $k_{31}$, Young's modulus $Y_{11}$, piezoelectric constant $d_{31}$, mechanical quality factor Qm, relative dielectric constant $\in_r$, dielectric tangent, $T_{to}$, $T_{ot}$, and $T_c$.

TABLE 4

| | Li Parts By Weight | Bi Parts By Weight | Electro-mechanical Coupling Factor $k_{31}$ (—) | Young's Modulus $Y_{11}$ (GPa) | Piezoelectric Constant $d_{31}$ (pm/V) | Mechanical Quality Factor Qm (—) | Relative Dielectric Constant $\in r$ (—) | Dielectric Tangent (—) | Tto (° C.) | Tot (° C.) | Tc (° C.) |
|---|---|---|---|---|---|---|---|---|---|---|---|
| Comparative Example 18 | 0.0036 | 0.025 | 0.238 | 121 | 81 | 569 | 1347 | 0.004 | −30 | −26 | 106 |
| Example 47 | 0.0046 | 0.084 | 0.241 | 118 | 88 | 646 | 1295 | 0.004 | −34 | −30 | 104 |
| Example 48 | 0.0023 | 0.170 | 0.238 | 122 | 86 | 820 | 1270 | 0.005 | −38 | −33 | 106 |
| Comparative Example 19 | 0.0026 | 0.170 | 0.236 | 123 | 82 | 620 | 1264 | 0.003 | −38 | −34 | 102 |
| Comparative Example 20 | 0.0058 | 0.170 | 0.233 | 121 | 80 | 703 | 1250 | 0.014 | −38 | −36 | 104 |
| Example 49 | 0.0100 | 0.250 | 0.237 | 122 | 88 | 800 | 1230 | 0.003 | −41 | −34 | 106 |
| Example 50 | 0.0130 | 0.840 | 0.238 | 118 | 83 | 1010 | 1150 | 0.004 | −43 | −39 | 108 |
| Comparative Example 21 | 0.0079 | 1.690 | 0.173 | 123 | 63 | 1000 | 1080 | 0.002 | <−100 | <−100 | 104 |
| Example 51 | 0.0086 | 0.250 | 0.235 | 126 | 92 | 809 | 1198 | 0.001 | −45 | −35 | 102 |
| Example 52 | 0.0095 | 0.250 | 0.217 | 131 | 76 | 853 | 1101 | 0.004 | −50 | −40 | 102 |
| Example 53 | 0.0160 | 0.250 | 0.221 | 134 | 72 | 944 | 1037 | 0.005 | −60 | −50 | 103 |
| Example 54 | 0.0086 | 0.250 | 0.231 | 144 | 77 | 870 | 876 | 0.003 | −55 | −45 | 106 |
| Comparative Example 22 | 0.0480 | 0.250 | 0.152 | 132 | 43 | 760 | 800 | 0.001 | −56 | −48 | 104 |

The test piece of the comparative example 19 does not contain any Mn component. It has been confirmed that the mechanical quality factor Qm of the test piece of the comparative example 19 is lower (by an amount of 200) than that of the test piece of the example 48.

It has been confirmed in a sample of the comparative example 20, which includes Mn by 0.36 parts by weight or more, that the dielectric tangent exceeds 0.01 and becomes higher than the dielectric tangent (i.e., 0.005) of the example 48.

The comparative example 18 has demonstrated a lower mechanical quality factor (i.e., 569) because the addition amount of the Bi component is less than 0.042 parts by weight.

The comparative example 21 has demonstrated a lower value with respect to the piezoelectric constant $d_{31}$ (approximately lower by 20 pm/V) compared to the example 50, because the addition amount of the Bi component is greater than 0.858 parts by weight.

The comparative example 22 has demonstrated a lower value with respect to the electromechanical coupling factor $k_{31}$ (i.e., less than 66% of the example 54) because the addition amount of the Li component is greater than 0.0280 parts by weight.

Example 55

The weighing of barium titanate ($BaTiO_3$), calcium titanate ($CaTiO_3$), calcium zirconate ($CaZrO_3$), lithium carbonate ($Li_2CO_3$), bismuth oxide ($Bi_2O_3$), tetramanganese trioxide ($Mn_3O_4$), and glass assistant containing Si and B (including $SiO_2$ by 30 to 50 wt. % and $B_2O_3$ by 21.1 wt. %) has been performed for a test piece in such a way as to attain the composition of the example 48 described in the table 3. The weighed raw material powder has been mixed in the ball mill for a night to obtain a mixed powder.

Then, the obtained mixed powder has been mixed with an additive of PVB and formed into a green sheet having a thickness of 50 μm according to a doctor blade method.

Then, to form an internal electrode, an electrically conductive paste has been printed on the above-mentioned green sheet. The electrically conductive paste used in this case is an alloy paste containing Ag 60%-Pd 40%. Then, a multilayered body has been obtained by successively stacking nine green sheets with the electrically conductive paste applied thereon. Then, a sintered compact has been obtained by sintering the above-mentioned multilayered body at 1200° C. for five hours. The sintered compact has been cut into a piece having a size of 10 mm×2.5 mm. Subsequently, side surfaces of the sintered compact have been polished and a pair of external electrodes (i.e., the first electrode and the second electrode), each electrically connecting the internal electrodes alternately, has been formed by Au sputtering. Through the above-mentioned processes, the multilayered piezoelectric element illustrated in FIG. 2B has been fabricated.

The observation on the internal electrodes of the obtained multilayered piezoelectric element has revealed that Ag—Pd (i.e., the electrode material) layers and piezoelectric material layers are alternately formed.

Prior to the evaluation of piezoelectricity, the test piece has been subjected to polarization processing. More specifically, the test piece has been heated in an oil bath at 100° C. A voltage of 1 kV/mm has been applied between the first electrode and the second electrode for 30 minutes. Then, under continuous application of the voltage, the test piece has been cooled until the temperature reaches the room temperature.

According to the evaluation of the piezoelectricity, it has been confirmed that the obtained multilayered piezoelectric element possesses sufficient insulating properties and also possesses satisfactory piezoelectric characteristics comparable to the piezoelectric material of the example 48.

Example 56

A mixed powder has been fabricated by using a method similar to that of the example 55. Then, a calcined powder has been obtained by performing calcination in the atmosphere at 1000° C. for three hours while rotating the obtained mixed powder in a rotary kiln. Then, the obtained calcined powder has been cracked in the ball mill. Then, the obtained cracked powder has been mixed with an additive of PVB and formed into a green sheet having a thickness of 50 μm according to the doctor blade method. Then, to form an internal electrode, an electrically conductive paste has been printed on the above-mentioned green sheet. The electrically conductive paste used in this case is a Ni paste. Then, a multilayered body has been obtained by successively stacking nine green sheets with the electrically conductive paste applied thereon. Then, the obtained multilayered body has been subjected to thermocompression bonding.

Further, the thermocompression-bonded multilayered body has been sintered in a tube furnace. The sintering has been performed in the atmosphere until the temperature increases to 300° C. Then, after being subjected to debinding, the sintered multilayered body has been placed in a reducing atmosphere ($H_2:N_2=2:98$, oxygen concentration $2\times10^{-6}$ Pa) and held at 1200° C. for five hours. In a temperature-fall process reaching the room temperature, the oxygen concentration has been switched to 30 Pa at 1000° C. or less.

Then, the sintered compact obtained in the above-mentioned manner has been cut into a piece having a size of 10 mm×2.5 mm. Subsequently, side surfaces of the sintered compact have been polished and a pair of external electrodes (i.e., the first electrode and the second electrode), each electrically connecting the internal electrodes alternately, has been formed by Au sputtering. Through the above-mentioned processes, the multilayered piezoelectric element illustrated in FIG. 2B has been fabricated.

The observation on the internal electrodes of the obtained multilayered piezoelectric element has revealed that Ni (i.e., the electrode material) layers and piezoelectric material layers are alternately formed. The obtained multilayered piezoelectric element has been subjected to polarization processing in the oil bath at 100° C. under application of the electric field of 1 kV/mm for 30 minutes. According to the evaluation of piezoelectric characteristics on the obtained multilayered piezoelectric element, it has been confirmed that the obtained multilayered piezoelectric element possesses sufficient insulating properties and also possesses satisfactory piezoelectric characteristics comparable to the piezoelectric element of the example 48.

Example 57

The piezoelectric element of the example 20 has been used to fabricate the liquid discharge head illustrated in FIG. 3. It has been confirmed that the fabricated liquid discharge head can discharge an ink according to an input electric signal.

Example 58

The liquid discharge head of the example 57 has been used to fabricate the liquid discharge apparatus illustrated in FIG. 4. It has been confirmed that the fabricated liquid discharge apparatus can discharge an ink to a recording medium according to an input electric signal.

Example 59

The piezoelectric element of the example 20 has been used to fabricate the ultrasonic motor illustrated in FIG. 6A. It has been confirmed that the fabricated ultrasonic motor can rotate according to an applied alternating voltage.

Example 60

The ultrasonic motor of the example 59 has been used to fabricate the optical device illustrated in FIG. 7. It has been confirmed that the fabricated optical device can perform an auto-focusing operation according to an applied alternating voltage.

Example 61

The piezoelectric element of the example 20 has been used to fabricate the dust removing apparatus illustrated in FIG. 9. It has been confirmed that the fabricated dust removing apparatus can attain satisfactory dust removal efficiency in the event of spraying plastic beads under application of an alternating voltage.

Example 62

The dust removing apparatus of the example 61 has been used to fabricate the imaging apparatus illustrated in FIG. 12. It has been confirmed that the fabricated imaging apparatus can adequately remove dust particles from a surface thereof when the imaging unit is in an operating mode and can obtain an image free from dust defect.

Example 63

The multilayered piezoelectric element of the example 55 has been used to fabricate the liquid discharge head illustrated in FIG. 3. It has been confirmed that the fabricated liquid discharge head can discharge an ink according to an input electric signal.

Example 64

The liquid discharge head of the example 63 has been used to fabricate the liquid discharge apparatus illustrated in FIG. 4. It has been confirmed that the fabricated liquid discharge apparatus can discharge an ink to a recording medium according to an input electric signal.

Example 65

The multilayered piezoelectric element of the example 55 has been used to fabricate the ultrasonic motor illustrated in FIG. 6B. It has been confirmed that the fabricated ultrasonic motor can rotate according to an applied alternating voltage.

Example 66

The ultrasonic motor of the example 65 has been used to fabricate the optical device illustrated in FIG. 7. It has been confirmed that the fabricated optical device can perform an auto-focusing operation according to an applied alternating voltage.

Example 67

The multilayered piezoelectric element of the example 55 has been used to fabricate the dust removing apparatus illustrated in FIG. 9. It has been confirmed that the fabricated dust removing apparatus can attain satisfactory dust removal efficiency in the event of spraying plastic beads under application of an alternating voltage.

Example 68

The dust removing apparatus of the example 67 has been used to fabricate the imaging apparatus illustrated in FIG. 12. It has been confirmed that the fabricated imaging apparatus can adequately remove dust particles from a surface thereof when the imaging unit is an operating mode and can obtain an image free from dust defect.

Example 69

The multilayered piezoelectric element of the example 55 has been used to fabricate the electronic device illustrated in FIG. 14. It has been confirmed that the fabricated electronic device can perform a speaker operation according to an applied alternating voltage.

The piezoelectric material according to the present invention possesses satisfactory piezoelectricity even in a high-temperature environment. Further, the piezoelectric material according to the present invention does not contain any lead component and therefore can reduce an environmental load. The piezoelectric material according to the present invention can be preferably used for various devices, such as a liquid discharge head, an ultrasonic motor, and a dust removing apparatus, in which many piezoelectric materials are used.

While the present invention has been described with reference to examples, it is to be understood that the invention is not limited to the disclosed examples. The scope of the following claims is to be accorded the broadest interpretation so as to encompass all such modifications and equivalent structures and functions.

This application claims the benefit of Japanese Patent Application No. 2013-146304 filed Jul. 12, 2013 and No. 2014-109342 filed May 27, 2014, which are hereby incorporated by reference herein in their entirety.

What is claimed is:
1. A piezoelectric material comprising:
a main component containing a perovskite-type metal oxide that can be expressed by the following general formula (1);
a first subcomponent containing Mn;
a second subcomponent containing Li; and
a third subcomponent containing Bi,
wherein the content of Mn on a metal basis is not less than 0.04 parts by weight and is not greater than 0.36 parts by weight when the metal oxide is 100 parts by weight, content $\alpha$ of Li on a metal basis is not less than 0.0013 parts by weight and is not greater than 0.0280 parts by weight when the metal oxide is 100 parts by weight, and content $\beta$ of Bi on a metal basis is not less than 0.042 parts by weight and is not greater than 0.850 parts by weight when the metal oxide is 100 parts by weight

$$(Ba_{1-x}Ca_x)_a(Ti_{1-y-z}Zr_ySn_z)O_3 \quad (1)$$

(in the general formula (1), $0.09 \leq x \leq 0.30$, $0.074 \leq y \leq 0.085$, $0 \leq z \leq 0.02$, and $0.986 \leq a \leq 1.02$).

2. The piezoelectric material described in claim 1, wherein the contents $\alpha$ and $\beta$ satisfy a relationship $0.5 \leq (\alpha \cdot MB)/(\beta \cdot ML) \leq 1$ (in which ML represents an atomic weight of Li and MB represents an atomic weight of Bi).

3. The piezoelectric material described in claim 1, wherein a relationship $0.075 \leq y$ is satisfied with respect to "y" in the general formula (1).

4. The piezoelectric material described in claim 1, wherein the piezoelectric material includes a fourth subcomponent containing Mg, and the content of the fourth subcomponent on a metal basis is equal to or less than 0.10 parts by weight (excluding 0 parts by weight) when the perovskite-type metal oxide that can be expressed using the general formula (1) is 100 parts by weight.

5. The piezoelectric material described in claim 1, wherein the piezoelectric material includes a fifth subcomponent that contains at least one of Si and B, and the content of the fifth subcomponent on a metal basis is not less than 0.001 parts by weight and is not greater than 4.000 parts by weight when the perovskite-type metal oxide that can be expressed using the general formula (1) is 100 parts by weight.

6. The piezoelectric material described in claim 1, wherein a relationship $0.19 < 2.15\alpha + 1.11\beta < 1$ is satisfied in the general formula (1).

7. The piezoelectric material described in claim 1, wherein a relationship $0.111 < 2.15\alpha + 1.11\beta < 0.333$ is satisfied in the general formula (1).

8. The piezoelectric material described in claim 1, wherein a relationship $y+z \leq (11x/14)-0.037$ is satisfied in the general formula (1).

9. The piezoelectric material described in claim 1, wherein a relationship $x \leq 0.17$ is satisfied in the general formula (1).

10. The piezoelectric material described in claim 1, wherein the Curie temperature of the piezoelectric material is equal to or greater than 100° C.

11. The piezoelectric material described in claim 1, wherein a dielectric tangent of the piezoelectric material at a frequency of 1 kHz is equal to or less than 0.006.

12. A piezoelectric element that includes a first electrode, a piezoelectric material portion, and a second electrode, wherein
a piezoelectric material that constitutes the piezoelectric material portion is the piezoelectric material described in claim 1.

13. A multilayered piezoelectric element that includes a plurality of piezoelectric material layers and a plurality of electrode layers including at least one internal electrode that are alternately multilayered, wherein the piezoelectric material layer is made of the piezoelectric material described in claim 1.

14. The multilayered piezoelectric element described in claim 13, wherein the internal electrode includes Ag and Pd and a relationship $0.25 \leq M1/M2 \leq 4.0$ is satisfied with respect to weight ratio M1/M2, in which M1 represents the content of Ag and M2 represents the content of Pd.

15. The multilayered piezoelectric element described in claim 13, wherein the internal electrode contains at least one of Ni and Cu components.

16. A liquid discharge head comprising:
a liquid chamber that is equipped with a vibrating unit in which the piezoelectric element described in claim 12 is disposed, and
a discharge port that communicates with the liquid chamber.

17. A liquid discharge apparatus comprising:
a portion on which an image transferred medium is placed, and
the liquid discharge head described in claim 16.

18. An ultrasonic motor comprising:
a vibrating body in which the piezoelectric element described in claim 12 is disposed, and
a moving body that contacts the vibrating body.

19. An optical device comprising:
a driving unit that includes the ultrasonic motor described in claim 18.

20. A vibrating apparatus comprising:
a vibrating body in which the piezoelectric element described in claim 12 is disposed on a vibration plate.

21. A dust removing apparatus comprising:
a vibrating unit in which the vibrating apparatus described in claim 20 is provided.

22. An imaging apparatus that includes the dust removing apparatus described in claim 21 and an image sensor unit, wherein a vibration plate of the dust removing apparatus is provided closely to a light-receiving surface of the image sensor unit.

23. An electronic device in which a piezoelectric acoustic device including the piezoelectric element described in claim 12 is disposed.

24. A liquid discharge head comprising:
a liquid chamber that includes a vibration unit in which the multilayered piezoelectric element described in claim 13 is disposed, and
a discharge port that communicates with the liquid chamber.

25. A liquid discharge apparatus comprising:
a portion on which an image transferred medium is placed, and
the liquid discharge head described in claim 24.

26. An ultrasonic motor comprising:
a vibrating body in which the multilayered piezoelectric element described in claim 13 is disposed, and
a moving body that contacts the vibrating body.

27. An optical device comprising:
a driving unit in which the ultrasonic motor described in claim 26 is provided.

28. A vibrating apparatus comprising:
a vibrating body in which the multilayered piezoelectric element described in claim 13 is disposed on a vibration plate.

29. A dust removing apparatus comprising:
a vibration unit in which the vibrating apparatus described in claim 28 is provided.

30. An imaging apparatus that includes the dust removing apparatus described in claim 29 and an image sensor unit, wherein a vibration plate of the dust removing apparatus is provided closely to a light-receiving surface of the image sensor unit.

31. An electronic device in which a piezoelectric acoustic device including the multilayered piezoelectric element described in claim 13 is disposed.

\* \* \* \* \*